(12) United States Patent
Yao et al.

(10) Patent No.: US 9,305,121 B2
(45) Date of Patent: Apr. 5, 2016

(54) METHOD AND SYSTEM FOR MODELING FRACTURES IN DUCTILE ROCK

(75) Inventors: Yao Yao, Houston, TX (US); Shekhar V. Gosavi, Houston, TX (US); Kevin H. Searles, Kingwood, TX (US); Timothy K. Ellison, Houston, TX (US)

(73) Assignee: ExxonMobil Upstream Research Company, Houston, TX (US)

( * ) Notice: Subject to any disclaimer, the term of this patent is extended or adjusted under 35 U.S.C. 154(b) by 630 days.

(21) Appl. No.: 13/698,243

(22) PCT Filed: Apr. 11, 2011

(86) PCT No.: PCT/US2011/031950
§ 371 (c)(1),
(2), (4) Date: Nov. 15, 2012

(87) PCT Pub. No.: WO2012/003027
PCT Pub. Date: Jan. 5, 2012

(65) Prior Publication Data
US 2013/0090902 A1    Apr. 11, 2013

Related U.S. Application Data

(60) Provisional application No. 61/359,157, filed on Jun. 28, 2010.

(51) Int. Cl.
*G06G 7/48* (2006.01)
*G06F 17/50* (2006.01)
*E21B 43/26* (2006.01)

(52) U.S. Cl.
CPC ............ *G06F 17/5009* (2013.01); *E21B 43/26* (2013.01); *G06F 17/5018* (2013.01)

(58) Field of Classification Search
CPC .. E21B 43/26; G06F 17/5009; G06F 17/5018
See application file for complete search history.

(56) References Cited

U.S. PATENT DOCUMENTS

| | | | |
|---|---|---|---|
| 8,548,782 B2 * | 10/2013 | Hsu et al. | 703/9 |
| 2008/0078479 A1 | 4/2008 | Xue | |
| 2008/0091396 A1 | 4/2008 | Kennon et al. | |
| 2011/0077918 A1 * | 3/2011 | Mutlu et al. | 703/2 |

OTHER PUBLICATIONS

Mace L., Souche L. and Mallet J.-L., 2004, 3D Fracture Modeling Integrating Geomechanics and Geologic Data, AAPG International Conference, Oct. 24-27, 2004; Cancun, Mexico.*
Benzeggagh, M. L., et al., (1996) "Measurement of Mixed-Mode Delamination Fracture Toughness of Unidirectional Glass/Epoxy Composites with Mixed-Mode Bending Apparatus," Composites Science and Technology, 56, pp. 439-449.

(Continued)

*Primary Examiner* — Aniss Chad
(74) *Attorney, Agent, or Firm* — ExxonMobil Upstream Research-Law Department

(57) ABSTRACT

Method and systems for modeling fractures in quasi-brittle materials are provided. An exemplary method included generating a model that incorporates a unified creep-plasticity (UCP) representation into a constitutive model for a ductile rock. The model may be used in a finite element analysis to model hydraulic fractures in the ductile rock.

18 Claims, 12 Drawing Sheets

(56) References Cited

OTHER PUBLICATIONS

Bazant, Z. P., (1982), "Crack Band Model for Fracture of Geomaterials," Proceedings of the Fourth International Conference on Numerical Methods in Geomechanics, vol. III, Edmonton, Alberta, Canada, pp. 1137-1152.

Chen, Z., et al., (2009), "Cohesive Zone Finite Element-Based Modeling of Hydraulic Fractures," Acta Mechanica Solida Sinica, vol. 22, No. 5, pp. 443-453.

Dean, R. H., et al., (2008), "Hydraulic Fracture Predictions with a Fully Coupled Geomechanical Reservoir Simulator," Annual Technical Conference and Exhibition, Denver, CO, SPE116470, pp. 1-12.

Leung, C. K. Y., et al., (1989), "Determination of fracture toughness parameter of quasi-brittle materials with laboratory-size specimens," Journal of Materials Science 24, pp. 854-862.

Martin, A.N., (2000), "Crack Tip Plasticity: A Different Approach to Modelling Fracture Propagation in Soft Formations," SPE Annual Technical Conference and Exhibit, Dallas, Texas, SPE 63171, pp. 1-11.

McDowell, D. L., et al., (1994), "A Unified Creep-Plasticity Theory for Solder Alloys," Fatigue Electronic Materials, ASTM STP, 1153, pp. 42-59.

Nordgren, R. P., (1972), "Propagation of a Vertical Hydraulic Fracture," Society of Petroleum Engineers Journal, Trans., 253, SPE3009, pp. 306-314.

Perkins, T. K., et al., (1961), "Widths of Hydraulic Fractures," Journal of Petroleum Technology, Trans., 222, SPE89, pp. 937-949.

Rice, J. R., et al., (1968), "Plane Strain Deformation Near a Crack Tip in a Power-Law Hardening Material," Journal Mech. Phys. Solids, 16, pp. 1-12.

Roe, K. L., et al., (2003), "An irreversible cohesive zone model for interface fatigue crack growth simulations," Engineering Fracture Mechanics, 70, pp. 209-232.

Rijken, P., et al., (2001), "Role of Shale Thickness on Vertical Connectivity of Fractures: Application of Crack-Bridging Theory to the Austin Chalk, Texas," Tectonophysics 337, pp. 117-133.

van Dam, D. B., et al., (2000), "Impact of Rock Plasticity on Hydraulic Fracture Propagation and Closure," SPE Annual Tech. Conf. and Exh., Richardson, Texas, SPE 63172, pp. 1-13.

Yao, Y., et al., (2009), "Fatigue Crack Propagation Behavior of Sn—Ag—Cu Solder Interconnects," IEEE Transactions on Components and Packaging Technologies, vol. 32, No. 2, pp. 317-324.

Zhai, Z., et al., (2005), "A New Approach to Modeling Hydraulic Fractures in Unconsolidated Sands," SPE Annual Technical Conference and Exhibit, Dallas, TX, SPE96246, pp. 1-14.

* cited by examiner

700

(a)

(b)

(c)

(d)

METHOD AND SYSTEM FOR MODELING FRACTURES IN DUCTILE ROCK

This application is the National Stage of International Application No. PCT/US11/31950, filed Apr. 11, 2011, which claims the benefit of U.S. Provisional Patent Application 61/359,157 filed Jun. 28, 2010 entitled METHOD AND SYSTEM FOR FRACTURES IN DUCTILE ROCK, the entirety of which is incorporated by reference herein.

FIELD OF THE INVENTION

Exemplary embodiments of the present techniques relate to a method and system for the analysis and modeling of fractures in quasi-brittle materials. Specifically, an exemplary embodiment provides for modeling hydraulic fractures in ductile rock.

BACKGROUND

This section is intended to introduce various aspects of the art, which may be associated with exemplary embodiments of the present techniques. This discussion is believed to assist in providing a framework to facilitate a better understanding of particular aspects of the present techniques. Accordingly, it should be understood that this section should be read in this light, and not necessarily as admissions of prior art.

As hydrocarbon reservoirs that are easily harvested, such as oil reservoirs on land or reservoirs located in shallow ocean water, are used up, other hydrocarbon sources must be used to keep up with energy demands. Such reservoirs may include any number of unconventional hydrocarbon sources, such as biomass, deep-water oil reservoirs, and natural gas from other sources.

One such unconventional hydrocarbon source is natural gas produced from shale, termed "shale gas." Because shale may have insufficient permeability to allow significant fluid flow to a well bore, many shales are currently not considered as commercial sources of natural gas. However, shale gas has been produced for years from shales with natural fractures. Recently, a significant increase in shale gas production has resulted from hydraulic fracturing, which is used to create extensive artificial fractures around well bores. When combined with horizontal drilling, which is often used with shale gas wells, the hydraulic fracturing may allow formerly unpractical shale layers to be commercially viable.

Shales that host economic quantities of gas have a number of common properties. They are rich in organic material and are usually mature petroleum source rocks in the thermogenic gas window. They are often sufficiently brittle and rigid enough to maintain open fractures, over a short period. Some of the gas produced is held in natural fractures, some in pore spaces, and some is adsorbed onto the organic material. The gas in the fractures can be produced immediately, while the gas adsorbed onto organic materials may be released as the formation pressure declines.

The fracturing process is complicated and can be modeled to improve the efficiency of the fracturing. A more efficient fracturing process may lead to a more productive reservoir. In other words, a greater amount of the gas trapped in a shale layer may be harvested. As discussed below, a number of researchers have proposed different techniques for modeling the growth of fractures in various rock formations.

In Perkins, T. K., and Kern, L. R., "Widths of Hydraulic Fractures," JPT, September, 222 Trans. AIME 937-949 (1961), a fluid mechanics study was performed on the rupture of brittle materials and the theory of elastic deformation of rock. The results indicated that for a given formation, crack (or fracture) width is essentially controlled by fluid pressure drop. High pressure drops result in relatively wide cracks, while low pressure drops result in relatively narrow cracks.

In Rice, J. R. and Rosengren, G. F., "Plane strain deformation near a crack tip in a power-law hardening material," 16 J. Mech. Phys. Solids 1-12 (1968), crack-tip strain singularities were investigated with the aid of an energy line integral exhibiting path independence for all contours surrounding a crack tip in a two-dimensional deformation field. Elastic and elastic/plastic materials were studied. The study determined that the product of stress and strain exhibits a singularity varying inversely with distance from the tip in all materials.

In Nordgren, R. P., "A Propagation of a Vertical Hydraulic Fracture," SPEJ, August, 306-314, Trans., AIME, 253 (1972), the propagation of hydraulic fractures of limited vertical and elliptic cross-section were studied with the inclusion of fluid loss. The study determined that the fracture length and width grow faster with time in the no-loss than in the large loss case.

In Leung, C. K. Y., and Li, V. C., 24 Journal of Materials Science 854-862 (1989), an experimental technique for indirectly determining a tension-softening curve, was developed. The tension-softening curve is suggested to be a size-independent fracture 'parameter' for quasi-brittle materials. The technique was based on generating specimens that had a large size and a four-point bending mode.

In McDowell D. L., Miller M. P., and Brooks D. C., "A Unified Creep-Plasticity Theory for Solder Alloys", 42 Fatigue Electronic Material AST STP 1153 (1994), the fracture behavior of solders was investigated. The goals of the study were to develop a thermo-mechanical unified creep-plasticity model, which could be used to characterize the response of solders, and to characterize a selected solder alloy through mechanical testing and correlation with the model across a range of strain rates, temperatures, aging times, and loading-unloading conditions. The model allowed the performance of solders under fatigue and creep-plasticity interactions due to thermo-mechanical cycling to be modeled.

In Benzeggagh and Kenane, "Measurement of mixed-mode delamination fracture toughness of unidirectional glass/epoxy composites with mixed-mode bending apparatus," 56 Composites Sci. Tech. 439-449 (1996), the initiation of cracking and delamination growth in a unidirectional glass/epoxy composite were evaluated under mode I, mode II, and mixed mode I+II static loading. In addition to the characterization of delamination, the apparatus allowed the plotting of an R curve, from which a total fracture resistance, $G_{TR}$, could be obtained.

In Martin, A. N., "Crack Tip Plasticity: A Different Approach to Modelling Fracture Propagation in Soft Formations," SPE 63171 (2000), a crack tip plasticity (CTP) method was developed, which assumed a fracture tip of finite radius, with a zone of plastically deformed material around it. The plastic zone forms when stresses on the rock increase beyond the yield point of the rock, at which point the rock starts to flow plastically. The plastic zone acts to absorb extra energy from the fracturing fluid, making it harder to propagate fractures through formations with significant plastic deformation. This in turn means that, for a given ductile material, fractures will be smaller and less conductive than those predicted by LEFM.

In van Dam, D. B., "Impact of Rock Plasticity on Hydraulic Fracture Propagation and Closure," SPE 63172 (2000), scaled laboratory experiments of hydraulic fracture propagation and closure in soft artificial rock and outcrop rock samples were performed. Numerical simulations of the fracture behavior in plastic rocks were also performed, using independently measured rock properties. The simulations aided in interpreting the measurements and extrapolating the results to field scale. Plasticity induces a larger width in a fracture for a given net pressure, compared with elastic rock. However, the pressure to propagate fractures was only marginally increased and, in the case of laboratory tests, was actually lower than expected from elastic behavior. The most dramatic effect of plasticity is that closure is much lower than the confining stress due to strong stress redistribution along the fracture.

In Dean, R. H. and Schmidt, J. H., "Hydraulic Fracture Predictions with a Fully Coupled Geomechanical Reservoir Simulator," SPE 116470 (2008), a geomechanical reservoir simulator was developed that combined hydraulic fracture growth, multiphase/multicomponent Darcy/nonDarcy porous flow, heat convection and conduction, solids deposition, and poroelastic/poroplastic deformation in a single application. The program contained two separate criteria that could be used to model fracture propagation: a critical fracture-opening criterion based on a stress intensity factor and a cohesive zone model that used quadrilateral cohesive elements in the fracture. The cohesive zone model includes a cohesive strength and an energy release rate in the calculations at the tip of a propagating hydraulic fracture.

U.S. Patent Application Publication No. 2008/0091396 by Kennon, et al., provides a method and system for modeling and predicting hydraulic fracture performance in hydrocarbon reservoirs. An unstructured automatic mesh is generated and computational algorithms are executed using a finite element numerical approach. The method is to model a hydrocarbon reservoir, wells, and completions as a single system, accounting for static information and transient behavior of wells, hydraulic fractures, and reservoirs in a single model. Models used for the fracture behavior are not disclosed.

Most of the current hydraulic fracture modeling in the oil industry continues to rely on empirical models, or on numerical methods based on linear elastic fracture mechanics (LEFM). Generally, these methods are valid for brittle materials and give reasonable predictions for hydraulic fractures in hard rocks. However, for ductile rock, such as shale, clay, weakly consolidated sandstones (low cohesion granular materials), or other relatively less brittle, softer, and/or more deformable rocks, the LEFM-based methods typically give overly conservative and often limited-use or unuseful predictions of fracture geometry.

SUMMARY

For ductile rock (which are quasi-brittle in nature), cohesive fracture mechanics based method can be used to simulate the fracture tip effect.

An exemplary embodiment of the present techniques provides a method for modeling fractures. The method includes generating a model that incorporates a unified creep-plasticity (UCP) representation into a constitutive model for a ductile rock.

The ductile rock forms fractures that may have a fracture process zone distributed over a finite size volume, which exhibits strain-softening. A ratio of a length of the fracture process zone to a length of a non-linear fracture zone located at the tip of the fracture may be between about 1:1 and 1:1.5.

The method may include predicting a J-integral value and stress field incorporated plasticity effect from finite element analysis using the model. The method may further include determining the effective fracture properties of the ductile rock. Further, the method may include determining the effective fracture properties of the ductile rock using a numerical method. A fracture in the ductile rock may be predicted by the method. A hydraulic fracture of the ductile rock may be predicted using a pore pressure cohesive zone model.

A flow of fluid may be determined in a fractured ductile rock using the method. A parameter in a fracturing process may be adjusted based, at least in part, on the predicted fracturing of the ductile rock. The parameter may be a mass flow rate, a pressure, or a combination thereof.

Another exemplary embodiment provides a method for modeling hydraulic fractures in ductile rocks. The method includes generating a constitutive model for a quasi-brittle material that incorporates unified creep-plasticity, performing a finite element analysis using the constitutive model, determining an effective fracture property for the quasi-brittle material, and predicting hydraulic fractures in the quasi-brittle material.

The method may also include adjusting a hydraulic fracturing parameter based, at least in part, on the fractures predicted in the ductile rock. A ratio between a length of a fracture process zone and a length of a non-linear fracture zone at the tip of a fracture may be between about 1:1 and 1:1.5.

Another exemplary embodiment provides a system for modeling fractures in a reservoir. The system includes a processor and a storage medium comprising a data structure comprising a model that incorporates unified creep-plasticity (UCP) into a constitutive model for a ductile rock. The system also includes a computer readable medium that includes code configured to direct the processor to perform a finite element analysis of the ductile rock using the model.

The processor may include a multi-processor cluster computer system. The computer readable medium may include code configured to direct the processor to run a finite element analysis for predicting a J-integral value and a stress field incorporating plasticity effect using the model. The computer readable medium may also include code configured to direct the processor to determine the fracture properties of the ductile rock. The computer readable medium may include code configured to direct the processor to predict a hydraulic fracture in the ductile rock. Further, the computer readable medium may include code configured to direct the processor to determine a flow of hydrocarbon in a fractured ductile rock.

Another exemplary embodiment of the present techniques provides a non-transitory, computer-readable medium that includes a data structure representing a model that combines a constitutive model with a unified creep-plasticity model. The non-transitory, computer-readable may include code configured to direct a processor to perform a finite element analysis using the model, determine an effective fracture property for a ductile rock, and predict fractures in the ductile rock.

Another exemplary embodiment provides a method for harvesting hydrocarbons from a ductile rock formation. The method includes generating a model that incorporates unified creep-plasticity (UCP) into a constitutive model for a ductile rock, performing a finite element analysis using the model, and predicting fractures in a ductile rock formation based, at least in part, upon a result from the finite element analysis. The method also includes fracturing the ductile rock formation using parameters based, at least in part, on the prediction of the fractures. Further, the method includes harvesting hydrocarbons from the fractured rock.

BRIEF DESCRIPTION OF THE DRAWINGS

The advantages of the present techniques are better understood by referring to the following detailed description and the attached drawings, in which.

DETAILED DESCRIPTION

Figure 1:
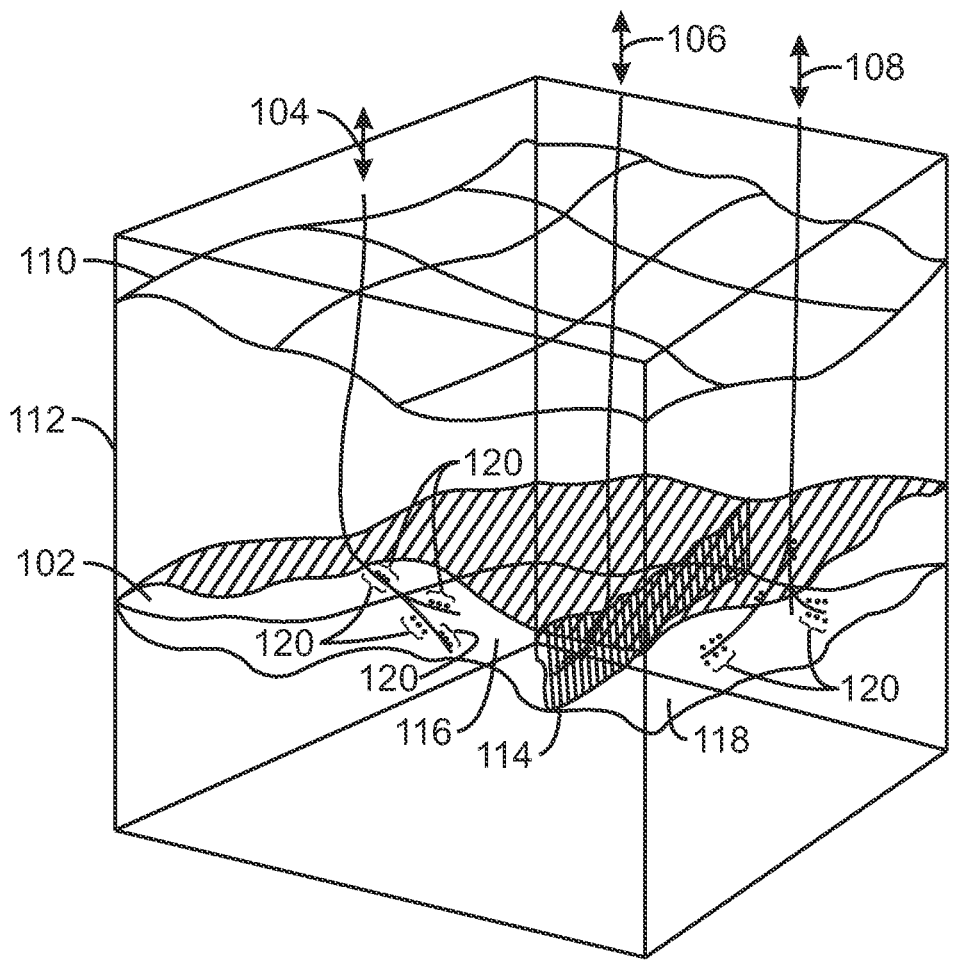
FIG. 1 is a diagram of a hydrocarbon reservoir, in accordance with an exemplary embodiment of the present techniques.

In the following detailed description section, the specific embodiments of the present techniques are described in connection with preferred embodiments. However, to the extent that the following description is specific to a particular embodiment or a particular use of the present techniques, this is intended to be for exemplary purposes only and simply provides a description of the exemplary embodiments. Accordingly, the present techniques are not limited to the specific embodiments described below, but rather, such techniques include all alternatives, modifications, and equivalents falling within the true spirit and scope of the appended claims.

At the outset, and for ease of reference, certain terms used in this application and their meanings as used in this context are set forth. To the extent a term used herein is not defined below, it should be given the broadest definition persons in the pertinent art have given that term as reflected in at least one printed publication or issued patent. Further, the present techniques are not limited by the usage of the terms shown below, as all equivalents, synonyms, new developments, and terms or techniques that serve the same or a similar purpose are considered to be within the scope of the present claims.

"Algorithm" carries its normal meaning and refers without limitation to any series of repeatable steps that result in a discrete value or values. For example, an algorithm may include any mathematical, statistical, positional, or relational calculation between any numbers of user-specified, preset, automatically-determined, or industry- or system-acceptable data elements. In several embodiments, various algorithms may be performed on subject data elements in relation to a previously defined data evaluation sample in order to produce a single, meaningful data value.

"Computer-readable medium" or "Non-transitory, computer-readable medium" as used herein refers to any non-transitory storage medium that participates in providing instructions to a processor for execution. Such a medium may include both non-volatile media and volatile media. Non-volatile media includes, for example, NVRAM, or magnetic or optical disks. Volatile media includes dynamic memory, such as main memory. Common forms of non-transitory, computer-readable media include, for example, a floppy disk, a flexible disk, a hard disk, an array of hard disks, a magnetic tape, or any other magnetic medium, magneto-optical medium, a CD-ROM, a holographic medium, and any other optical medium from which a computer can read data or instructions. Further, the non-transitory, computer-readable media may also include a memory device, such as a RAM, a PROM, an EPROM, a FLASH-EPROM, a solid state medium like a memory card, any other memory chip or cartridge, or any other tangible medium from which a computer can read data or instructions.

A "rock constitutive model" is a data construct that interrelates stress and strain properties. In physics, a constitutive equation is a relation between two physical quantities (often described by tensors) that is specific to a material or substance, and approximates the response of that material to external forces. It is combined with other equations governing physical laws to solve physical problems. For the analysis described herein, constitutive relations connect applied stresses or forces to strains or deformations. The stress-strain constitutive relation for linear materials commonly is known as Hooke's law. In exemplary embodiments, the rock constitutive model described herein incorporates nonlinear effects, strain rate, and temperature dependencies, as well as plasticity and creep effects. The model may be stored in a non-transitory computer-readable medium for use by a processor during simulation and modeling calculations.

"Exemplary" is used exclusively herein to mean "serving as an example, instance, or illustration." Any embodiment described herein as "exemplary" is not to be construed as preferred or advantageous over other embodiments.

"Formation" refers to a body of rock or other subsurface solids that is sufficiently distinctive and continuous that it can be mapped, for example, by seismic techniques. A formation can be a body of rock of predominantly one type or a combination of types. A formation can contain one or more hydrocarbon-bearing zones. Note that the terms formation, reservoir, and interval may be used interchangeably, but will generally be used to denote progressively smaller subsurface regions, zones, or volumes. More specifically, a formation will generally be the largest subsurface region, a reservoir will generally be a region within the formation and will generally be a hydrocarbon-bearing zone (a formation, reservoir, or interval having oil, gas, heavy oil, and any combination thereof), and an interval will generally refer to a sub-region or portion of a reservoir. A hydrocarbon-bearing zone can be separated from other hydrocarbon-bearing zones by zones of lower permeability such as mudstones, shales, or shale-like (highly compacted) sands. In one or more embodiments, a hydrocarbon-bearing zone includes heavy oil in addition to sand, clay, or other porous solids.

A "fracture" is a crack or surface of breakage within rock not related to foliation or cleavage in metamorphic rock along which there has been minimal movement. A fracture along which there has been lateral displacement may be termed a fault. When walls of a fracture have moved only normal to each other, the fracture may be termed a joint. Fractures may enhance permeability of rocks greatly by connecting pores together, and for that reason, joints and faults may be induced mechanically in some reservoirs in order to increase fluid flow.

"Fracturing" refers to the structural degradation of a subsurface shale formation from applied thermal or mechanical stress. Such structural degradation generally enhances the permeability of the shale to fluids and increases the accessibility of the hydrocarbon component to such fluids.

"Fracture gradient" refers to a fluid pressure sufficient to create or enhance one or more fractures in the subterranean formation. As used herein, the "fracture gradient" of a layered formation also encompasses a parting fluid pressure sufficient to separate two or more adjacent bedding planes in a layered formation. It should be understood that a person of ordinary skill in the art could perform a simple leak-off test on a core sample of a formation to determine the fracture gradient of a particular formation.

"Hydrocarbons" are generally defined as molecules formed primarily of carbon and hydrogen atoms such as oil and natural gas. Hydrocarbons may also include other elements, such as, but not limited to, halogens, metallic elements, nitrogen, oxygen, and/or sulfur. Hydrocarbons may be produced from hydrocarbon reservoirs through wells penetrating a hydrocarbon containing formation. Hydrocarbons derived from a hydrocarbon reservoir may include, but are not limited to, kerogen, bitumen, pyrobitumen, asphaltenes, oils, or combinations thereof. Hydrocarbons may be located within or adjacent to mineral matrices within the earth. Matrices may include, but are not limited to, sedimentary rock, sands, silicilytes, carbonates, diatomites, and other porous media.

A "hydraulic fracture" is a fracture at least partially propagated into a formation, wherein the fracture is created through injection of pressurized fluids into the formation. While the term "hydraulic fracture" is used, the techniques described herein are not limited to use in hydraulic fractures. The techniques may be suitable for use in any fracture created in any manner considered suitable by one skilled in the art. Hydraulic fractures may be substantially horizontal in orientation, substantially vertical in orientation, or oriented along any other plane. Generally, the fractures tend to be vertical at greater depths, due to the increased pressure of the overburden.

"Hydraulic fracturing" is a process used to create fractures that extend from the well bore into formations to stimulate the potential for production. A fracturing fluid, typically viscous, is generally injected into the formation with sufficient pressure (for example, at a pressure greater than the lithostatic pressure of the formation) to create and extend a fracture. A proppant may often be used to "prop" or hold open the created fracture after the hydraulic pressure used to generate the fracture has been released. Parameters that may be useful for controlling the fracturing process include the pressure of the hydraulic fluid, the viscosity of the hydraulic fluid, the mass flow rate of the hydraulic fluid, the amount of proppant, and the like.

As used herein, "material properties" represents any number of physical constants that reflect the behavior of a ductile rock or quasi-brittle material. Such material properties may include, for example, Young's modulus (E), Poisson's Ratio ($\Phi$), tensile strength, compression strength, shear strength, creep behavior, and other properties. The material properties may be measured by any combinations of tests, including, among others, a "Standard Test Method for Unconfined Compressive Strength of Intact Rock Core Specimens," ASTM D 2938-95; a "Standard Test Method for Splitting Tensile Strength of Intact Rock Core Specimens [Brazilian Method]," ASTM D 3967-95a Reapproved 1992; a "Standard Test Method for Determination of the Point Load Strength Index of Rock," ASTM D 5731-95; "Standard Practices for Preparing Rock Core Specimens and Determining Dimensional and Shape Tolerances," ASTM D 4435-01; "Standard Test Method for Elastic Moduli of Intact Rock Core Specimens in Uniaxial Compression," ASTM D 3148-02; "Standard Test Method for Triaxial Compressive Strength of Undrained Rock Core Specimens Without Pore Pressure Measurements," ASTM D 2664-04; "Standard Test Method for Creep of Cylindrical Soft Rock Specimens in Uniaxial Compressions," ASTM D 4405-84, Reapproved 1989; "Standard Test Method for Performing Laboratory Direct Shear Strength Tests of Rock Specimens Under Constant Normal Stress," ASTM D 5607-95; "Method of Test for Direct Shear Strength of Rock Core Specimen," U.S. Military Rock Testing Handbook, RTH-203-80, available at "http://www.wes.army.mil/SL/MTC/handbook/RT/RTH/203-80.pdf" (last accessed on Jun. 25, 2010); and "Standard Method of Test for Multistage Triaxial Strength of Undrained Rock Core Specimens Without Pore Pressure Measurements," U.S. Military Rock Testing Handbook, available at http://www.wes.army.mil/SL/MTC/handbook/RT/RTH/204-80.pdf" (last accessed on Jun. 25, 2010). One of ordinary skill will recognize that other methods of testing rock specimens may be used to determine the physical constants used herein.

"Permeability" is the capacity of a rock to transmit fluids through the interconnected pore spaces of the rock. Permeability may be measured using Darcy's Law: $Q=(k\Delta P \, A)/(\mu L)$, where Q=flow rate (cm$^3$/s), $\Delta P$=pressure drop (atm) across a cylinder having a length L (cm) and a cross-sectional area A (cm$^2$), $\mu$=fluid viscosity (cp), and k=permeability (Darcy). The customary unit of measurement for permeability is the millidarcy. The term "relatively permeable" is defined, with respect to formations or portions thereof, as an average permeability of 10 millidarcy or more (for example, 10 or 100 millidarcy). The term "relatively low permeability" is defined, with respect to formations or portions thereof, as an average permeability of less than about 10 millidarcy. An impermeable layer generally has a permeability of less than about 0.1 millidarcy. By these definitions, shale may be considered impermeable, for example, ranging from about 0.1 millidarcy (100 microdarcy) to as low as 0.00001 millidarcy (10 nanodarcy).

"Poisson's ratio" of an elastic material is a material property that describes the amount of radial expansion when subject to an axial compressive stress (or deformation measured in a direction perpendicular to the direction of loading). Poisson's ratio is the ratio of the elastic material radial deformation (strain) to its axial deformation (strain), when deformed within its elastic limit. Rocks usually have a Poisson's ratio ranging from 0.1 to 0.4. The maximum value of Poisson's ratio is 0.5 corresponding to an incompressible material (such as water). It is denoted by the Greek letter ν (nu) and is a unit-less ratio.

A "reservoir" or "hydrocarbon reservoir" is defined as a pay zone (for example, hydrocarbon-producing zones) that includes sandstone, limestone, chalk, coal, and some types of shale. Pay zones can vary in thickness from less than one foot (0.3048 m) to hundreds of feet (hundreds of m). The permeability of the reservoir formation provides the potential for production.

"Reservoir properties" and "Reservoir property values" are defined as quantities representing physical attributes of rocks containing reservoir fluids. The term "Reservoir properties" as used in this application includes both measurable and descriptive attributes. Examples of measurable reservoir property values include impedance to p-waves, impedance to s-waves, porosity, permeability, water saturation, and fracture density. Examples of descriptive reservoir property values include facies, lithology (for example, sandstone or carbonate), and environment-of-deposition (EOD). Reservoir properties may be populated into a reservoir framework of computational cells to generate a reservoir model.

A "rock physics model" relates petrophysical and production-related properties of a rock formation to the bulk elastic properties of the rock formation. Examples of petrophysical and production-related properties may include, but are not limited to, porosity, pore geometry, pore connectivity volume of shale or clay, estimated overburden stress or related data, pore pressure, fluid type and content, clay content, mineralogy, temperature, and anisotropy and examples of bulk elastic properties may include, but are not limited to, P-impedance and S-impedance. A rock physics model may provide values that may be used as a velocity model for a seismic survey.

"Shale" is a fine-grained clastic sedimentary rock with a mean grain size of less than 0.0625 mm. Shale typically includes laminated and fissile siltstones and claystones. These materials may be formed from clays, quartz, and other minerals that are found in fine-grained rocks. Non-limiting examples of shales include Barnett, Fayetteville, and Woodford in North America. Shale has low matrix permeability, so gas production in commercial quantities requires fractures to provide permeability. Shale gas reservoirs may be hydraulically fractured to create extensive artificial fracture networks around well bores. Horizontal drilling is often used with shale gas wells.

"Strain" is the fractional change in dimension or volume of the deformation induced in the material by applying stress. For most materials, strain is directly proportional to the stress, and depends upon the flexibility of the material. This relationship between strain and stress is known as Hooke's law, and is presented by the formula: $f/S=-Y(\partial \xi/\partial x)$.

"Stress" is the application of force to a material, such as a through a hydraulic fluid used to fracture a formation. Stress can be measured as force per unit area. Thus, applying a longitudinal force f to a cross-sectional area S of a strength member yields a stress which is given by f/S.

The force f could be compressional, leading to longitudinally compressing the strength member, or tensional, leading to longitudinally extending the strength member. In the case of a strength member in a seismic section, the force will typically be tension.

"Thermal fractures" are fractures created in a formation caused by expansion or contraction of a portion of the formation or fluids within the formation. The expansion or contraction may be caused by changing the temperature of the formation or fluids within the formation. The change in temperature may change a pressure of fluids within the formation, resulting in the fracturing. Thermal fractures may propagate into or form in neighboring regions significantly cooler than the heated zone.

The "Young's modulus" of a rock sample is the stiffness of the rock sample, defined as the amount of axial load (or stress) sufficient to make the rock sample undergo a unit amount of deformation (or strain) in the direction of load application, when deformed within its elastic limit. The higher the Young's modulus, the harder it is to deform, and, thus, the more brittle the rock. It is an elastic property of the material and is usually denoted by the English alphabet E having units the same as that of stress.

Overview

Exemplary embodiments of the present techniques provide a systematic analysis method to determine hydraulic fracture behavior of various ductile rocks. The method can employ an energy-based cohesive fracture mechanics model that incorporates unified creep-plasticity (UCP) into a constitutive model. A temperature and strain-rate-dependent constitutive relationship for ductile rock can be incorporated into the computational model through finite element analysis. The singularity ahead of the fracture tip may be simulated using collapsed quadrilateral elements in the finite element analysis. From the model that is developed, the important mechanical parameters for the simulation of ductile rock fracture behavior, such as the J-integral value and the stress field around the fracture, can be numerically determined for hydraulic fracture modeling. The fundamental difference of linear elastic fracture mechanics and cohesive fracture mechanics-based analysis can then be exploited from both theoretical and computational aspects. Based on the analysis of the fracture process zone of ductile rock, the effective fracture material properties that account for the effect of rock ductility are calculated and applied in currently available hydraulic fracture modeling tools.

FIG. 1 is a diagram 100 of a hydrocarbon reservoir 102, in accordance with an exemplary embodiment of the present techniques. The hydrocarbon reservoir 102 may be a shale layer containing economically valuable quantities of natural gas. Wells 104, 106, and 108, may be drilled from the surface 110 through the overburden 112 to reach the reservoir 102. As indicated by the bidirectional arrows, each of the wells 104, 106, and 108 may be used for injection, for example, to fracture the rock of the reservoir 102, and for production, such as the harvesting of hydrocarbons from the reservoir 102. The conversion from fracturing the reservoir 102 to harvesting hydrocarbons does not have to be limited to one cycle, as several cycles of fracturing and harvesting may be alternated.

The rock of the reservoir 102 may have a complex structure, for example, with faults 114 or other layers separating regions 116 and 118 of the reservoir 102. Accordingly, multiple wells may be used to access the different regions. For example, in reservoir 102 shown in the diagram 100, two wells 104 and 106 are used to access a first region 116 on one side of a fault 114, while a third well 108 is used to access a second region 118 on the opposite side of the fault 114.

As mentioned previously, the relatively low permeability of rock in a reservoir 102 may make fracturing the rock useful for harvesting economically viable amounts of hydrocarbons. The fracturing may be performed by any number of techniques used for delivering energy to the rock of the reservoir 102. For example, thermal fracturing may be used to expand rock layers in or around the reservoir 102, causing stresses that lead to the formation of fractures. Thermal fracturing may also cause cracking by causing the expansion of fluids within the reservoir 102, which creates hydraulic fractures. The present techniques are not limited to any particular type of fracturing, as they are generally focused on the modeling of fracture growth in ductile rock layers.

Each of the wells 104, 106, or 108, may have perforations 120 through a well casing into the rocks of the reservoir 102, indicated by dots along the wells 104, 106, or 108. A fracturing fluid may be pumped at high pressure through the perforations into the reservoir 102. When the pressure of the fluid exceeds the strength of the rock layer, fractures will form as the rock breaks. The fracturing fluid may be aqueous or non-aqueous, and may contain materials to hold open fractures that form. These materials, known as proppants, may include natural or synthetic materials such as sand, gravel, ground shells, glass beads, or metal beads, among others. The hydraulic fracturing process is discussed in further detail with respect to FIG. 2.

Figure 2:
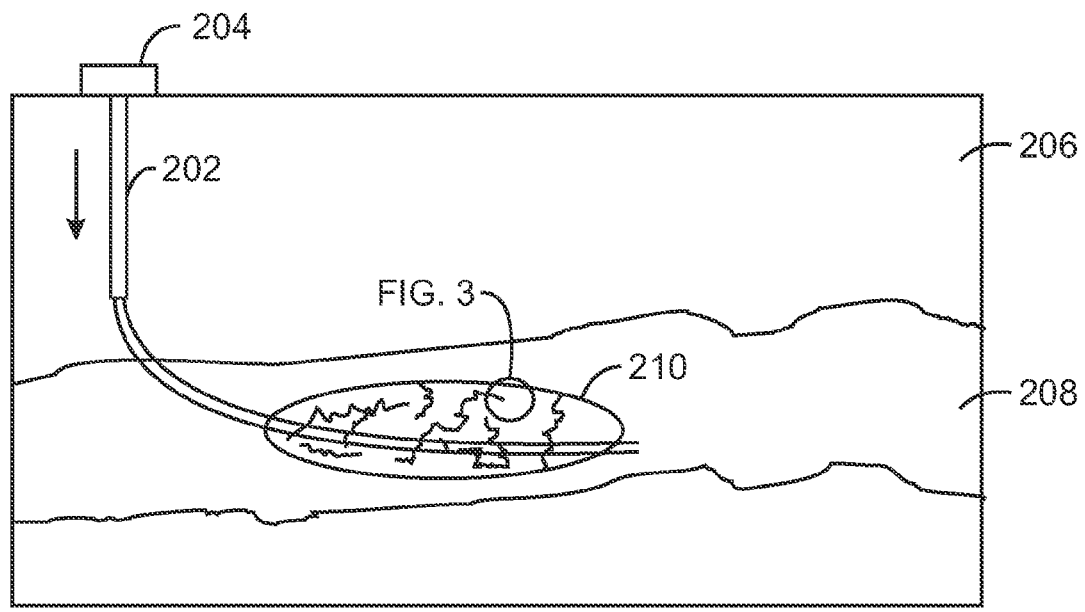
FIG. 2 is a diagram that shows hydraulic fracturing through a single well extending from a surface facility through an overburden into a reservoir, in accordance with an exemplary embodiment of the present techniques.

FIG. 2 is a diagram 200 that shows hydraulic fracturing through a single well 202 extending from a surface facility 204 through an overburden 206 into a reservoir 208, in accordance with an exemplary embodiment of the present techniques. Perforations along the well 202 can allow pressurized fracturing fluid to flow into the formation, creating a fracture zone 210 around the perforated section of the well 208. The fracture zone 210 may be considered a network or "cloud" of fractures generally radiating out from the well 202. Each fracture is a crack formed in the rock, as discussed with respect to a close up view shown in FIG. 3.

Figure 3:
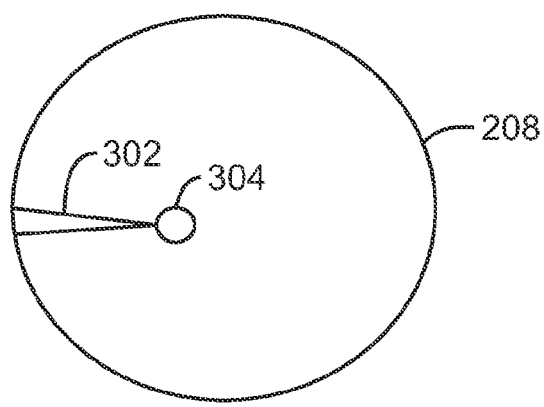
FIG. 3 is a close-up view of a fracture forming in the reservoir of FIG. 2.

FIG. 3 is a close-up view of a fracture 302 forming in the reservoir 208 of FIG. 2. As shown in FIG. 3, a zone 304 may be created ahead of the tip of the fracture 302. Previous models, based on linear-elastic fracture mechanics (LEFM) often assumed that the zone 304 at the tip of the fracture 302 had minimal volume. This assumption provided inaccurate results for some materials, as discussed further with respect to FIG. 4.

Figure 4:
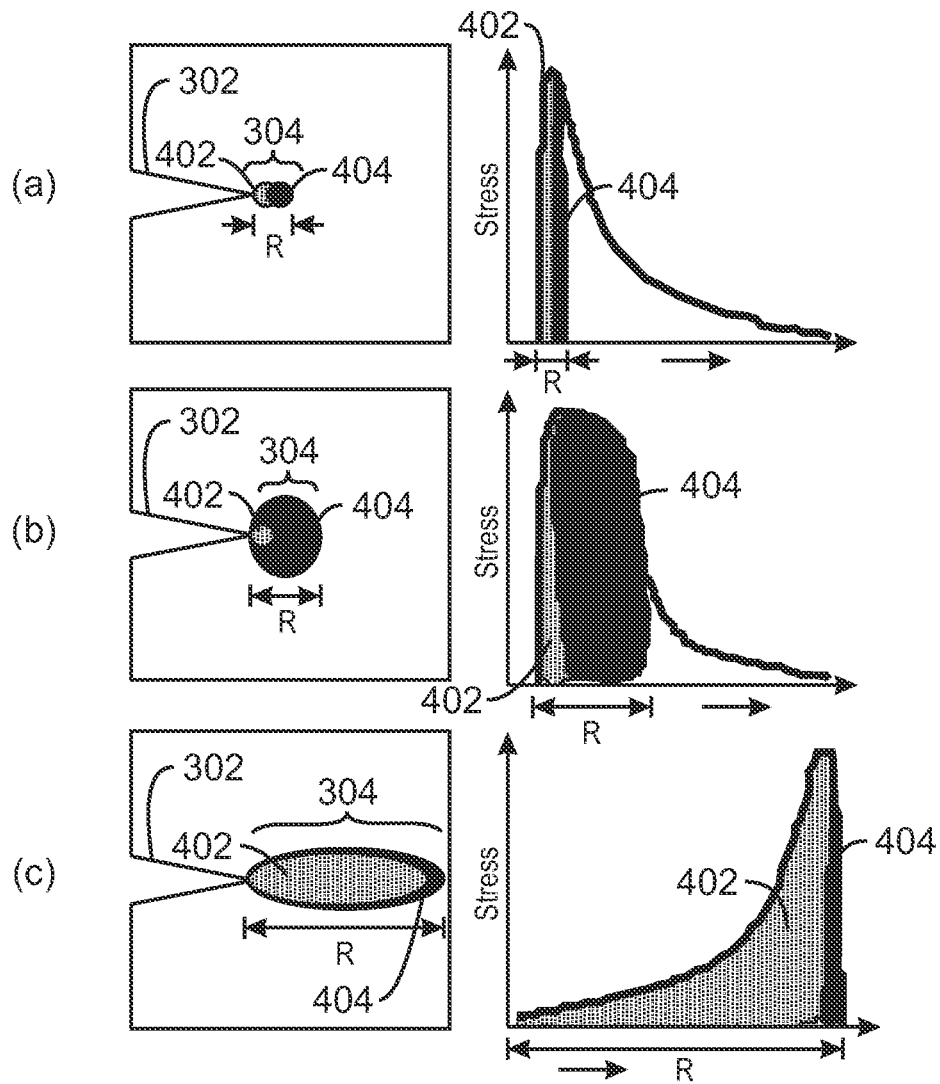
FIG. 4 shows a non-linear fracture zone ahead of a fracture in materials ranging from brittle to ductile.

FIG. 4 shows a non-linear fracture zone 304 ahead of a fracture 302 in materials ranging from brittle to ductile. The non-linear fracture zone 304 ahead of the fracture 302 consists of two zones: the fracture process zone 402 characterized by progressive softening and a nonlinear hardening zone 404 characterized by perfect plasticity or plastic hardening. The stress versus distance in front of each crack tip is shown in the graphs on the right. FIG. 4(*a*) shows a non-linear fracture zone 304 for a very brittle material, such as glass, ceramics, and the like. Since the entire non-linear fracture zone 304 is small (e.g., a singularity) compared to the size of the fracture 302, linear elastic fracture mechanics (LEFM) is applicable in this case, and the material toughness term, K, dominates. FIG. 4(*b*) shows the non-linear fracture zone 304 for a very ductile material where the softening or fracture process zone 402 is still small, but the nonlinear hardening zone 404 is not negligible, such as ductile metals, tough alloys, many plastics, and the like. In this case, the nonlinear hardening zone 404 dominates the fracture behavior and elasto-plastic fracture mechanics using the energy of the fracture, e.g., the J-integral, can be employed.

FIG. 4(*c*) shows the behavior of a quasi-brittle material, such as concrete, cemented aggregates, many rocks, and the like. In these materials, a major part of the non-linear fracture zone 304 is a fracture process zone 402, which undergoes progressive damage with material softening due to micro-cracking and void formation. The cracking in the fracture process zone can be distributed over a finite size volume, which exhibits so-called strain-softening, for example, a stress strain relation in which the maximum principal stress decreases with corresponding increasing principal strain. Here, cohesive fracture mechanics-based theory can be applied, in accordance with exemplary embodiments of the present techniques. The ratio of the fracture process zone 402 to the nonlinear zone 304 in a quasi-brittle material may be about 1:1, 1:1.2, or 1:1.5.

Most ductile rock, such as ductile shale, follows this behavior. In exemplary embodiments of the present techniques, a constitutive model for rock behavior is revised to incorporate plasticity and creep effects in modeling of hydraulic fractures, as discussed with respect to FIG. 5, creating a UCP constitutive model. A cohesive zone model or CZM can then be used to determine the fracture properties.

Incorporation of Unified Creep Plasticity Theory into a Constitutive Model to Simulate Temperature and Strain-Rate-Dependent Behavior of Ductile Rock.

Figure 5:
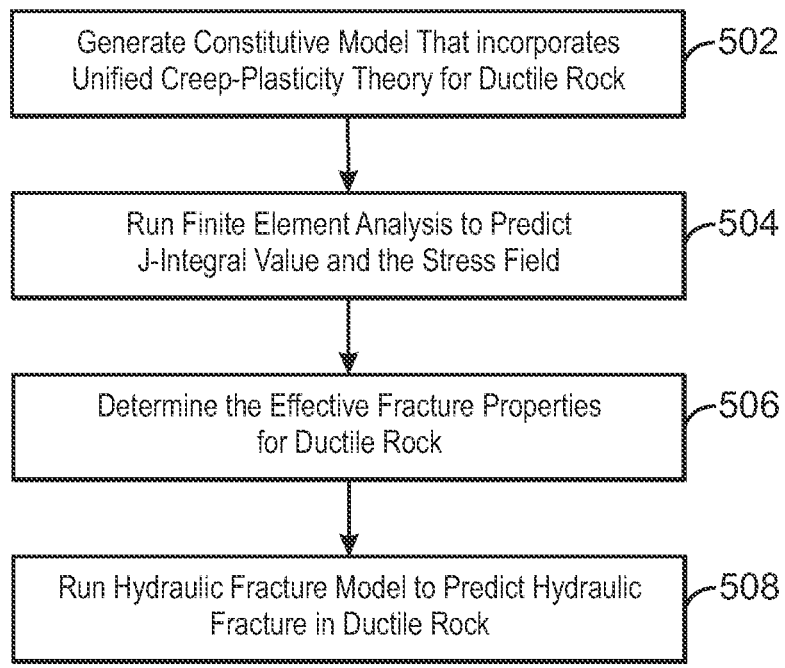
FIG. 5 is a process flow chart of a method for modeling fractures in ductile rock, in accordance with an exemplary embodiment of the present techniques.

FIG. 5 is a process flow chart of a method 500 for modeling fractures in ductile rock, in accordance with an exemplary embodiment of the present techniques. The method begins at block 502 with the generation of a constitutive model that incorporates a unified creep-plasticity (UCP) theory.

In an exemplary embodiment of the present techniques, an appropriate rock constitutive model interrelates the behavior of ductile rock, such as shale, with load and boundary conditions. As noted above, the model differs from models for more brittle rocks by incorporating creep and plasticity effects into the constitutive model for ductile rock. Both of these effects, creep and plasticity, arise in ductile rock during long term, high rate injection or production of fluids. Unified creep-plasticity (UCP) theory can be used to address these physical effects.

The constitutive model may be strain rate and temperature dependent. The UCP theory can be incorporated into the finite element model based on the viscoplasticity theory, as would be understood by one of skill in the art. The model can be programmed into a finite element modeling software. For example, a user-defined subroutine may be linked to the finite element analysis (FEA) analysis package. The theory gives accurate predictions for the constitutive relationship of ductile rock. Generally, some experimentally determined material constants are needed to describe the mechanical behaviors and damage evolution to achieve a reasonable accuracy, such as tensile strength, Young's modulus, Poisson's ratio, fracture toughness etc. The stress-strain relationship can be measured from a standard tri-axial or poly-axial experiment, and other material parameters, such as the A and B discussed with respect to Eqn. 2, can be fitted using experimental data. Such as tensile strength, Young's modulus, Poisson's ratio, fracture toughness etc. The stress-strain relationship can be measured from a standard tri-axial or poly-axial experiment, the other material parameters such as A, B can be fitted using experimental data.

For low or impermeable ductile rock, the relationship between stress rate a and strain rate can be written as shown in Eqn. 1.

$$\dot{\sigma} = C(T):(\dot{\varepsilon}-\dot{\varepsilon}^{in}-\varphi T I) + C^{-1}:\sigma:\frac{\partial C}{\partial T}\dot{T} \qquad \text{Eqn. 1}$$

In Eqn. 1, C represents the matrix of the elastic constants and is a function of Poisson's ratio ν, Young's modulus E(T), and absolute temperature T. The constant ε represents the total strain rate; $\dot{\varepsilon}^{in}$ represents the inelastic strain rate; φ represents the coefficient of thermal expansion and I represents the unit tensor. Accordingly, the term φT I refers to the thermal strain rate.

The form of the flow rule for inelastic strain rate can be given by the formula in Eqn. (2):

$$\dot{\varepsilon}^{in} = \sqrt{\frac{3}{2}}\, A\!\left(\frac{S_v}{d}\right)^{\!n} \exp\!\left(B\!\left(\frac{S_v}{d}\right)^{\!n+1}\right)\!\Theta(T) N \qquad \text{Eqn. 2}$$

In Eqn. 2, d represents the drag strength, A and B represent material constants; and the diffusivity term $\Theta(T)=\exp(-Q/(kT))$. Here A is a creep material constant, B is just a unitless material constant, both of the parameters can be fit from experimental data. Q represents the apparent activation energy and k is the universal gas constant.

N represents a unit vector in the direction of the deformation loading defined by: $N=(S-\alpha)/\|S-\alpha\|$, where the deviatoric stress tensor can be obtained by subtracting the hydrostatic stress tensor from the stress tensor defined by: $S=\sigma-\text{tr}(\sigma)/3$; $S_v$ represents the viscous overstress defined as $$S_v = \left\langle \sqrt{\frac{3}{2}} \|S-\alpha\| - R \right\rangle,$$

in which R is the yield stress radius and $\alpha$ is the deviatoric back stress. The evolutionary law for $\alpha$ is defined as $\dot{\alpha}=\mu\|\dot{\epsilon}^{in}\|N-\beta\alpha$, where $\mu$ and $\beta$ are material constants. It can be understood that $\alpha$ reaches a saturated value along with the loading process. The R term is determined by $R=R_{initial}+R_{add}$ and $\dot{R}_{add}=\overline{\omega}\dot{\chi}$, in which $\overline{\omega}$ is a material constant and $\chi$ is the hardening from the dislocation increment within the material, which is defined as $\dot{\chi}=\mu\|\dot{\epsilon}^{in}\|(\overline{\chi}-\chi)$, where $\overline{\chi}$ is the sutured value of $\chi$; $\mu$ is a material constant. The material constants for the model can be obtained through analysis of the material behavior and by fitting to the experimental data for different rocks. Such material constants may include tensile strength, fracture toughness, Young's modulus, permeability, A, and B, among others.

The result of block 502 is a UCP constitutive model that may be used to predict fractures in quasi-brittle materials, for example, as discussed with respect in FIG. 4(*c*). Such materials may include shales, concretes, plastic composites, and other materials having a large fracture process zone.

Predicting the J-Integral Value and the Stress Field from Finite Element Analysis, Using a UCP Constitutive Model that Accounts for Ductility.

At block 504, the constitutive model for ductile rock defined at block 502 can be analyzed by performing finite element analysis to predict the value of the J-integral and the stress field considering plastic deformation energy. To simulate the singularity at the fracture tip, a ring of collapsed quadrilateral elements can be used to perform the modeling in the fracture tip region, as discussed further with respect to FIG. 6.

Figure 6:
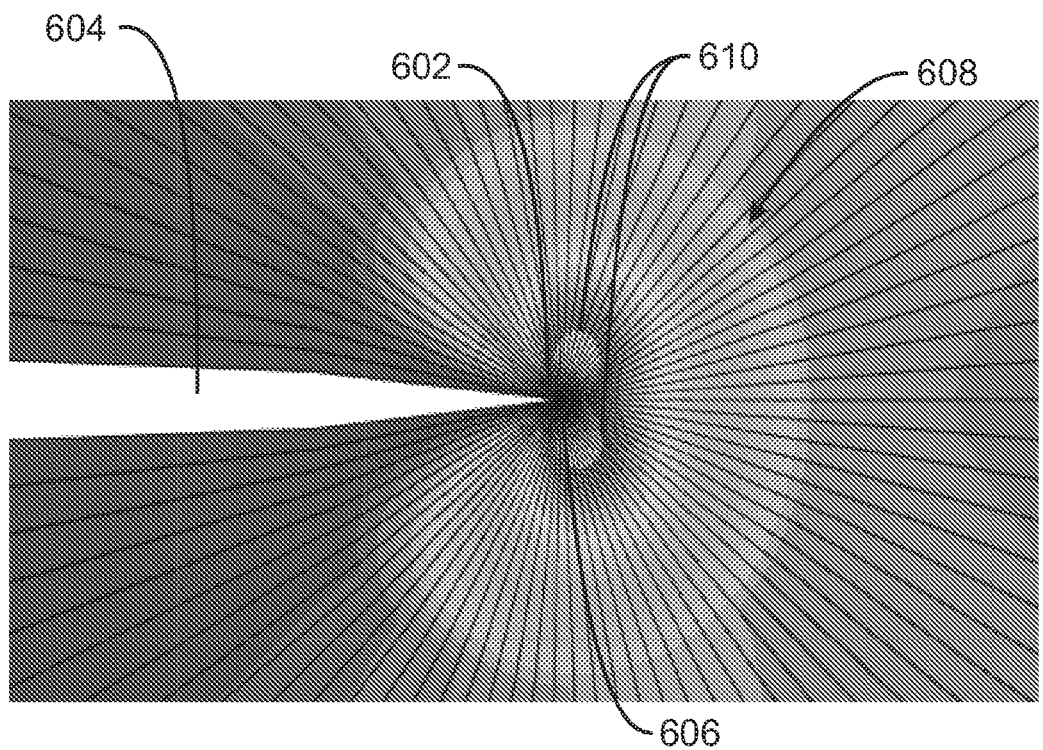
FIG. 6 is a graph of a von Mises stress distribution ahead of a fracture tip, in accordance with an exemplary embodiment of the present techniques.

FIG. 6 is a graph 600 of a von Mises stress distribution ahead of a fracture tip, in accordance with an exemplary embodiment of the present techniques. To simulate the singularity at the tip 602 of the fracture 604, a ring 606 of collapsed quadrilateral elements can be used to perform the modeling in a region 608 surrounding the tip 602 of the fracture 604. For example, in an exemplary embodiment, the quadrilateral elements may be the CPS8R elements in the finite element analysis program ABAQUS, available from Dassault Systèmes under the SIMULIA brand. The mid-side nodes 610 on the sides, connected to the fracture tip, can be moved to the ¼ point nearest to the fracture tip, and a quarter point spacing with second-order isoparametric elements can then be created. The J-integral and stress field can be predicted numerically from the model by considering plasticity effect combined with revised rock constitutive model.

More specifically, the J-integral value and the stress field can be predicted from the finite element analysis by employing the UCP constitutive model to consider ductility, e.g., the plastic deformation energy. The three-dimensional expression of the J-integral can be defined as shown in Eqn. 3.

$$J_l = -\int_\Gamma \sigma_{ij} n_j u_{i,l} \, dS + \int_\Gamma W n_l \, dS = \int_\Gamma P_{lj} n_j \, dS \qquad \text{Eqn. 3}$$

In Eqn. 3, the Maxwell energy-momentum tensor is $P_{lj}=W\delta_{lj}-\sigma_{ij}u_{i,l}$ and $W=\int_0^{\epsilon_{ij}}\sigma_{ij}d\epsilon_{ij}$ and $W_{,l}=\sigma_{ij}\epsilon_{ij,l}$. Further, $$\varepsilon_{ij} = \frac{1}{2}(u_{i,j} + u_{j,i})$$

and the integration path $\Gamma$ is an arbitrary closed contour followed counterclockwise surrounding the fracture tip in a stressed body. Additional, in Eqn. 3, $\sigma_{ij}$ represents the stress, $\epsilon_{ij}$ represents the strain, $u_i$ represents the displacement, and $n_j$ represents the normal vector on the boundary dS.

It may be assumed that the released energy rate to create a crack or fracture is equal to the value of the J-integral, $$J = G = \frac{K_c^2}{E'},$$

in which J represents the J-integral value, G represents the energy release rate, $K_c$ represents the fracture toughness and E' represents the Young's modulus. The fracture toughness is equal to $\sqrt{JE'}$, and the value of J is determined from numerical simulation, which accounts for plastic deformation and energy as discussed with respect to block 502.

Because the plasticity deformation and energy has been incorporated in the finite element analysis through the revised rock constitutive model, the effective fracture toughness value can be determined numerically from the predicted J-integral value. The effective fracture parameters method can be applied to consider plasticity effect in hydraulic fracture, as discussed below.

Determination of the Ductile Rock Fracture Parameters by Cohesive Fracture Mechanics and Numerical Modeling.

Returning to FIG. 5, the effective fracture properties for the ductile rock may be determined at block 506 by either theoretical or numerical methods. One of the reasons that LEFM-based methods may fail to give accurate predictions for ductile rock is that these methods neglect the fracture process zone ahead of the fracture tip, which may be significant in ductile rock fracture analysis. In LEFM, R is often assumed to be infinitesimally small.

Theoretically, the fundamental mechanical difference of LEFM and cohesive fracture mechanics-based methods can be explained by the size of the fracture process zone and its effect on fracture extension in ductile rock. The softening behavior ahead of the fracture tip can be considered by employing revised fracture properties. For ductile shale, which is quasi-brittle in nature, the effective fracture toughness can be derived to accommodate the ductile behavior based on the fracture characteristic length ahead of fracture tip, as discussed with respect to FIG. 7.

Figure 7:
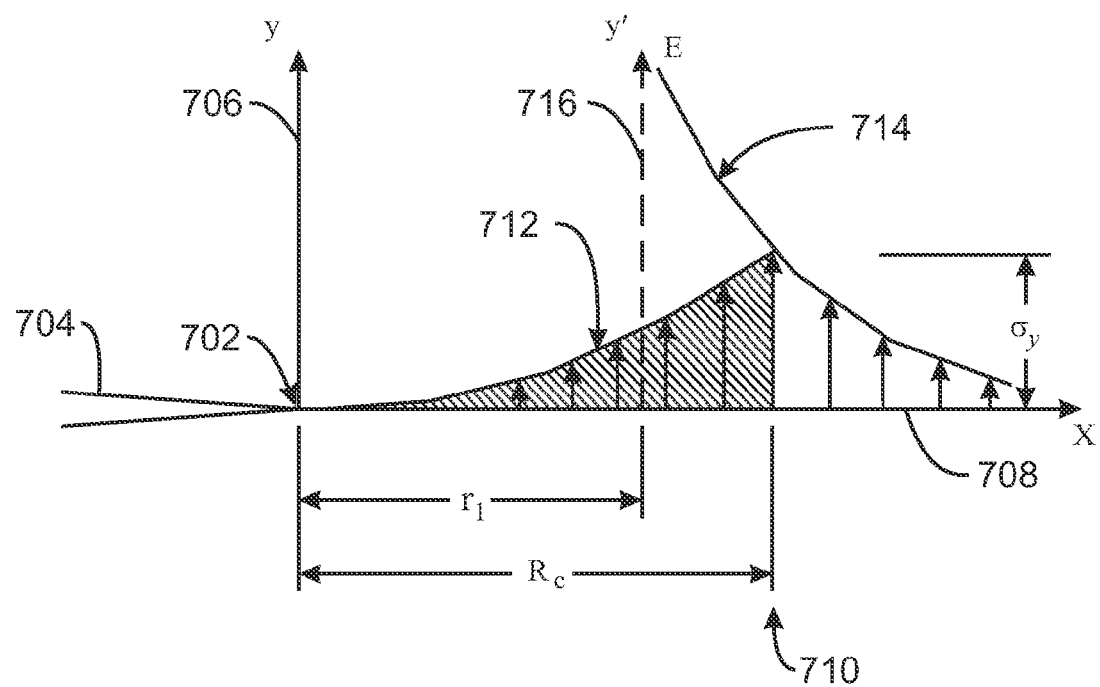
FIG. 7 is graph illustrating the estimation of the fracture toughness for a nonlinear softening material-ductile rock based on the size of the fracture process zone, in accordance with an exemplary embodiment of the present techniques.

FIG. 7 is graph illustrating the estimation of the fracture toughness for a nonlinear softening material-ductile rock based on the size of the fracture process zone, in accordance with an exemplary embodiment of the present techniques. Based on size of the fracture process zone, $R_C$, ahead of tip 702 of the fracture 704, a straightforward method can be developed to consider the effect of ductility on fracture parameters. In this graph 700, the y-axis 706 represents stress, while the x-axis 708 represents the distance from the fracture tip 702. The highest stress point 710 has a stress represented by $\sigma_y$, and occurs at the tip of the fracture process zone 304 that is farthest from the fracture tip 702, as discussed with respect to FIG. 4. By assuming a finite size, fracture process zone, $R_C$, ahead of the fracture tip 702, the length of the nonlinear fracture zone and softening of the ductile rock can be determined and used to estimate the fracture toughness. The rock softening may be assumed to be parabolic, resulting in a formula for the stress of a first curve 712, located before the end of the fracture process zone $R_C$ of $$\sigma_{yy} = f_t \left(\frac{x}{R_C}\right)^n.$$

A second curve 714 after the fracture process zone $R_C$ may have a formula for the stress of $$\sigma_{yy} = \frac{K_{IC}}{\sqrt{2\pi(x - r_1)}}.$$

In these equations, n represents the parabolic distribution degree, $\sigma_{yy}$ represents the calculated stress, $f_t$ represents rock tensile strength, and x represents the distance from the fracture tip 702. $R_C$ represents the length of the fracture process zone, $r_1$ represents the distance of the equivalent elastic crack to be shifted ahead of the true fracture tip, and $K_{IC}$ represents the effective fracture toughness of the rock.

The y-axis 706 may be shifted by drawing a new y-axis, y' 716 at the point at which the area under the second curve 714 from x=$r_1$ to $R_C$ is equal to the area under the first curve 712 from x=0 to $R_C$. Applying this "equivalent area rule" to the equations above provides the formula shown in Eqn. 4.

$$\int_{r_1}^{R_c} K_{IC}[2\pi(x-r_1)]^{-1/2} dx = \int_0^{R_c} f_t' \left(\frac{x}{R_c}\right)^n dx = \frac{1}{n+1} R_c f_t' \quad \text{Eqn. 4}$$

After integration, Eqn. 4 gives $$R_c = \frac{n+1}{\pi}\left(\frac{K_{IC}}{f_t'}\right)^2 = \left(\frac{K_{eff}}{f_t'}\right)^2,$$

and the effective fracture toughness can be defined by the formula shown in Eqn. 5.

$$K_{eff} = \sqrt{\frac{n+1}{\pi}} K_{IC} \quad \text{Eqn. 5}$$

In these formulas, the value of the softening parabolic distribution degree n can be determined for different rock materials to include the fracture tip effect on fracture growth. The idealized characteristic length of fracture can be defined by $$l_c = \left(\frac{K_{IC}}{f_t'}\right)^2.$$

The actual characteristic length of the fracture can then be represented by $$l_c = \frac{n+1}{\pi}\left(\frac{K_{IC}}{f_t'}\right)^2.$$

For typical quasi-brittle materials such as concrete, the value of $$\frac{n+1}{\pi}$$

usually varies from 2 to 5, for example, $K_{eff}$=1.414~2.236$_{IC}$. For ductile rock, the value of n can be experimentally or numerically determined from the value of the J-integral considering plastic strain effect to the fracture energy by fitting experimental or numerical analysis data to a rock stress-strain relationship. Thus, the numerical model proposed herein can be applied to determine the effective fracture parameter because plasticity strain is incorporated in the rock constitutive model. The numerical investigation of effective material properties such as fracture toughness can be determined from the results of computational model discussed herein.

Predict Hydraulic Fracturing of Ductile Rock Based on the Results from Previous Steps.

Returning to FIG. 5, at block 508, the model developed above can be run to predict fracture formation in ductile rock, for example, from hydraulic fracturing. In an exemplary embodiment, a pore pressure cohesive zone model (pore pressure CZM) is developed to predict hydraulic fracture during injection using the model developed above. The pore pressure CZM is a numerical approach developed to model fracture initiation and growth that may be used in quasi-brittle materials that have a material softening effect. The method 500 treats the fracture as a gradual process in which separation between incipient material surfaces is resisted by cohesive tractions. The fracture initiation and propagation can be predicted from the pore pressure CZM analysis through the application of a finite element analysis incorporating the UCP constitutive model.

The damage mechanics incorporated in the model can be introduced and the damage initiation and evolution conditions can be defined. The pore pressure CZM has been applied herein to hydraulic fracture growth using different rock properties. Based on the computational and theoretical analysis discussed above, a revision to fracture parameters, such as fracture toughness, can be implemented to account for the ductile effects.

In an exemplary embodiment, the pore pressure CZM is used to predict hydraulic fracture of injection wells. By combining CZM with the UCP constitutive model, discussed with respect to block 502, the hydraulic fracture of ductile rock can be predicted directly though finite element analysis. For other hydraulic fracture model or CZM with an elastic constitutive model, the effective fracture parameter method can be applied to predict plasticity effect conveniently.

To incorporate a cohesive zone model into finite element analysis, the principle of virtual work can be modified to the formula shown in Eqn. 6.

$$\int_V P : \delta \tilde{F} dV - \int_{S_i} \vec{T}_{CZ} \cdot \delta \Delta \vec{u} \, dS = \int_{\partial V} \vec{T}_e \cdot \delta \vec{u} \, dS \quad \text{Eqn. 6}$$

The principle assumes that the total work done by all forces acting on a system in static equilibrium is zero for any infinitesimal displacement from equilibrium, which is consistent with the constraints of the system. This may also be known as the virtual work principle. In Eqn. 6, $\tilde{P}$ represents the nominal stress tensor, which equals $\tilde{F}^{-1} \det(\tilde{F})\sigma$. $\tilde{F}$ represents the deformation gradient and $\sigma$ represents the Cauchy stress tensor. V represents the control volume, and $\vec{u}$ represents the displacement vector. $\vec{T}_{CZ}$ represents the cohesive zone traction vector and $\vec{T}_e$ represents the traction vector on the external surface of the body. $S_i$ represents the internal boundary and $\partial V$ represents the external boundary of V.

Figure 8:
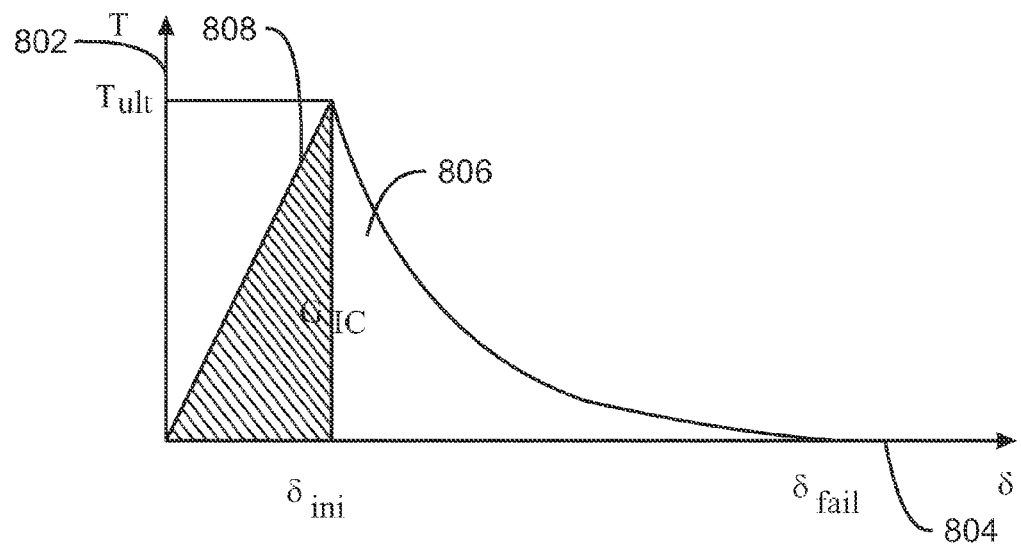
FIG. 8 is a graph illustrating the cohesive element traction-separation (T-S) Law used in the CZM, in accordance with an exemplary embodiment of the present technique.

FIG. 8 is a graph 800 illustrating the cohesive element traction-separation (T-S) Law used in the CZM, in accordance with an exemplary embodiment of the present technique. The Traction-separation (T-S) Law may be used to define the constitutive response of a cohesive element layer directly in terms of traction (applied force) versus separation (fracture opening/displacement). In FIG. 8, the y-axis 802 represents the tensile force (T) and the x-axis 804 represents the separation distance ($\delta$). The maximum height is the maximum tensile force, $T_{ult}$, reached before a fracture initiates at $\delta_{ini}$. The point at which no tensile forces remain on the system is $\delta_{fail}$, which represents complete failure of the rock. The area 806 under the curve represents the energy placed on the rock. The area 808 under the curve up to $\delta_{ini}$, represents the energy needed to initiate failure.

The leak-off model in pore pressure CZM is based on hydraulic fluid continuity. The tangential permeability, $k_t$ is defined based on Reynold's equation, $k_t = d^3/12\mu$, where $\mu$ represents the fluid viscosity, d represents the gap opening defined by $d = t_{curr} - t_{orig} + g_{init}$, and $t_{curr}$ and $t_{orig}$ are the current and original cohesive element geometrical thicknesses, respectively. As would be understood, in the ABAQUS software, it is actually resistance to fluid flow rather than permeability. The term $g_{init}$ is the initial gap opening, which has a default value of 0.002. Permeability of reservoir rock, or hydraulic conductivity, $\bar{k}$, is used in a flow model based on Darcy's equations for permeability $$\hat{k} = \frac{v}{g}\bar{k} = \frac{\mu}{\rho g}\bar{k} \text{ (m/s)}.$$

In this equation, v represents kinematic viscosity, $\mu$ represents dynamic viscosity, $\rho$ represents fluid density (=1 for water), and g represents gravity acceleration (=9.8 m/s²).

A quadratic nominal stress criterion can be used to predict damage initiation in the pore pressure CZM. Damage can be assumed to initiate when a quadratic interaction function involving the nominal stress ratios reaches unity. This criterion can be represented as $$\left(\frac{\langle t_n \rangle}{t_n^0}\right)^2 + \left(\frac{t_s}{t_s^0}\right)^2 + \left(\frac{t_t}{t_t^0}\right)^2 = 1.$$

In this equation, $t_n$, $t_s$, $t_t$ refer to the normal, the first, and the second shear stress components. The terms, $t_n^0$, $t_s^0$, $t_t^0$ represent the peak values of the nominal stress when the deformation is either purely normal to the interface or in the first or the second shear direction. The symbol $\langle \rangle$ is the usual Macaulay bracket interpretation, used to signify that a purely compressive deformation or stress state does not initiate damage.

The damage evolution for mixed mode failure is defined based on Benzeggagh-Kenane fracture criterion, when the critical fracture energies during deformation along the first and the second shear directions are similar; i.e. $G_s^C = G_t^C$. The criteria can be given by $$G_n^C + (G_s^C - G_n^C)\left(\frac{G_S}{G_T}\right)^\eta = G^C,$$

in which the mixed-mode fracture energy, $G^C = G_n + G_s + G_t$. $G_n$, $G_s$, and $G_t$ refer to the work done by the traction and its conjugate relative displacement in the normal, the first, and the second shear directions, respectively. $G_n^C$, $G_s^C$ and $G_t^C$ refer to the critical fracture energies required to cause failure in the normal, the first, and the second shear directions, respectively. $\eta$ is a material parameters that represents softening behavior, i.e., a shape of the softening curve, and may be determined by polyaxial or triaxial rock cell experiments.

The effective material properties predicted from the use of the pore pressure CZM can also be used in other current available LEFM-based hydraulic fracture tools. For example, the effective fracture toughness may be used in the pseudo 3D fracture model to revise the prediction by considering ductility effects.

Examples

A short-term water injection case with zero leak-off was analyzed to investigate the accuracy of the fracture geometry prediction using a pore pressure CZM based on the UCP constitutive model described herein. The predicted fracture length and $\delta_{fail}$ is given in Table 1. The result shows that, compared with previous LEFM-based models, for example, a standard Pseudo 3D model and the Perkins-Kern-Nordgren method, the pore pressure CZM-based method predicted the fracture length more accurately.

TABLE 1

Fracture length predicted using different models

| | CZM | Pseudo 3D | PKN | Analytical solution (Dean et al. 2008) |
|---|---|---|---|---|
| Fracture length (ft) | 147.5 | 180 | 183 | 141.5 |
| $\delta_{fail}$ (in) | 0.0059 | — | — | 0.0060 |

As another example, the pore pressure CZM was used to predict the effects of different parameters on fracture geometry, as shown in Table 2. Based on the parametric analysis, increases in Young's modulus (E) of the rock results in decrease of the fracture width, while the fracture length and height increases. Increase of injection rate, increases fracture width, length and height. As shown in Table 2 and discussed with respect to FIG. 13, increasing the leak-off coefficient decreases fracture width, length, and height. Increasing injected fluid viscosity results in decreasing of the fracture length, while fracture width and height increase.

TABLE 2

Effects of different parameters to fracture geometry predicted using pore pressure CZM

| Parameter | Fracture width | Fracture Length | Fracture Height |
|---|---|---|---|
| Rock E ↑ | ↓ | ↑ | ↑ |
| Inj. rate ↑ | ↑ | ↑ | ↑ |
| Leak-off coef. ↑ | ↓ | ↓ | ↓ |
| Fracture fluid viscosity ↑ | ↑ | ↓ | ↑ |

Figure 9:
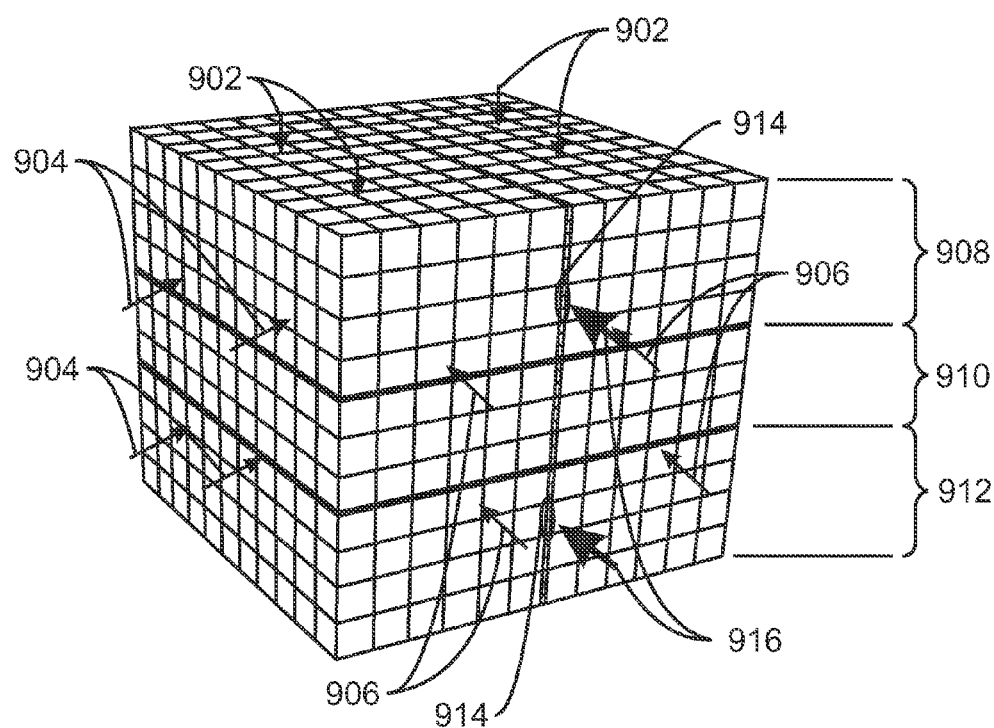
FIG. 9 is a drawing of a three-layer 3D pore pressure cohesive element model that may be used to predict hydraulic fracture caused by fluid injection using exemplary embodiments of the current techniques.

FIG. 9 is a drawing of a three-layer 3D pore pressure cohesive element model 900 that may be used to predict hydraulic fracture caused by fluid injection using exemplary embodiments of the current techniques. The overburden 902, side burden 904, and pore pressure 906 boundary conditions are applied. The model 900 has three layers, a top layer 908 of hard rock, a middle layer 910, and a lower layer 912 of ductile rock. The top and bottom layers 908 and 912 have perforations (or fractures) 914, for example, caused by pressure from the injection of a fracturing fluid, as indicated by larger arrows 916. The results from this model are discussed with respect to FIG. 10.

Figure 10:
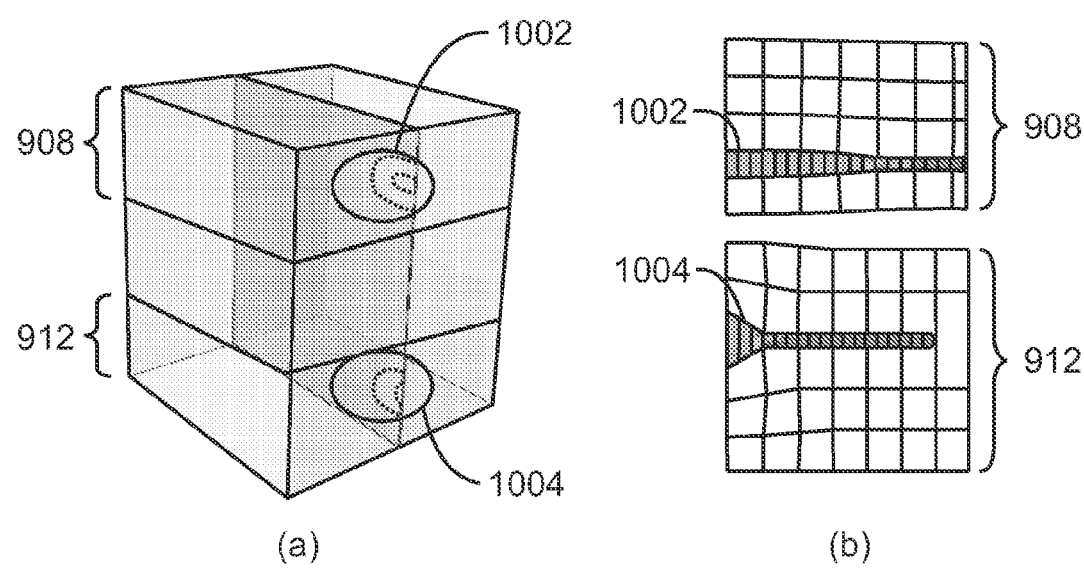
FIG. 10 is an illustration of a fracture geometry predicted for the model of FIG. 9, in accordance with exemplary embodiments of the present techniques.

FIG. 10 is an illustration of a fracture geometry predicted for the model of FIG. 9, in accordance with exemplary embodiments of the present techniques. A pore pressure CZM was used to predict a first fracture 1002 into the brittle top layer 908 using an elastic (LEFM) constitutive model. The pore pressure CZM was used to predict a second fracture 1004 into the quasi-brittle bottom layer 912 using a plastic constitutive model, as described herein. It can be seen that the first fracture 1002, in the hard rock of the top layer 908, is longer and narrower than the second fracture 1004 in the ductile rock of the bottom layer 912. A shorter fracture 1004 in the ductile rock layer 912 may be because a larger deformation in a ductile rock absorbs more energy than in a hard rock, and, therefore, less energy is being used to extend the second fracture 1004.

Figure 11:
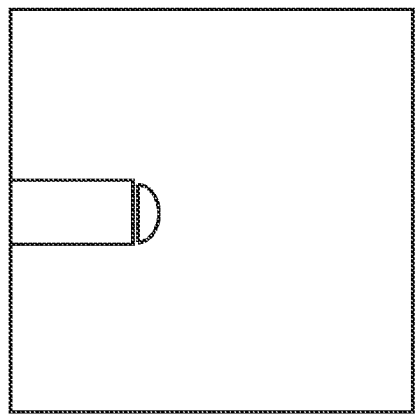
FIG. 11 is a series of graphs illustrating predicted fracture propagation prediction of finite element analysis using a UCP constitutive model, in accordance with exemplary embodiments of the present techniques.
Figure 11:
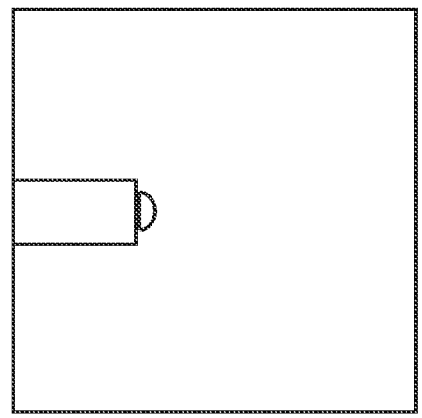
Figure 11:
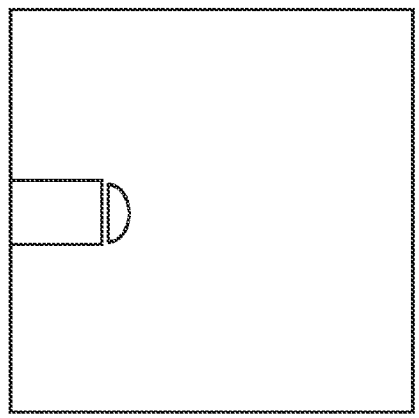
Figure 11:
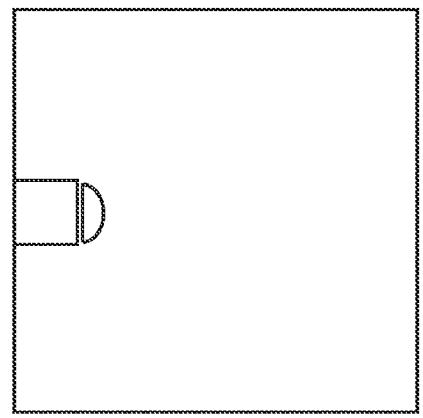
Figure 12:
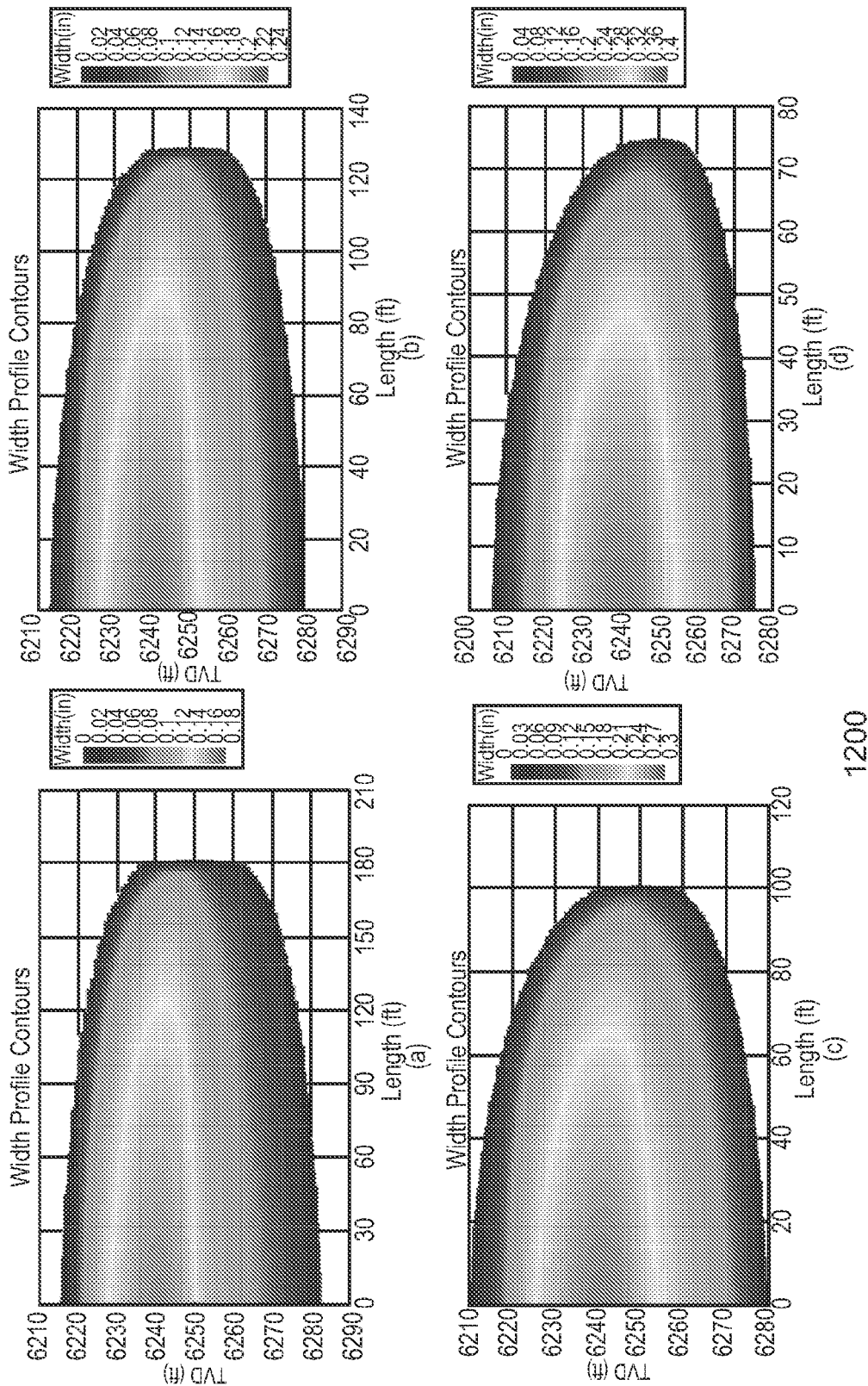
FIG. 12 is a series of graphs from a finite element analysis that illustrate changes in the fracture propagation predictions from a pseudo 3D model, in accordance with exemplary embodiments of the present techniques.

In another example, for a pseudo 3D hydraulic model or finite element analysis with elastic rock constitutive model, the effective fracture parameter can be used to simulate the plasticity effect by applying the method developed in the present techniques. FIGS. 11 and 12 illustrate a fracture propagation prediction with different effective fracture toughness values using the finite element analysis and pseudo 3D model, respectively.

FIG. 11 is a series of graphs illustrating predicted fracture propagation prediction of finite element analysis using a UCP constitutive model, in accordance with exemplary embodiments of the present techniques. The finite element analysis shown in each of the four graphs was performed at different calculated fracture toughness values. Thus, to generate the graph of FIG. 11(a), the fracture toughness, $K_{eff}$, was set equal to the toughness under the LEFM assumptions, $K_{Ic}$. To generate FIG. 11(b), $K_{eff}$ was set to 1.5 $K_{Ic}$. To generate FIG. 11(c), $K_{eff}$ was set to 2 $K_{Ic}$. Finally, to generate FIG. 11(d), $K_{eff}$ was set to 3 $K_{Ic}$. As shown in these graphs, the fracture length decreases as the effective fracture toughness increases, simulating the plasticity effect. This matches the physical observation made in field applications. Further confirmation of this effect can be provided using other models, for example, as discussed with respect to FIG. 12.

FIG. 12 is a series of graphs from a finite element analysis that illustrate changes in the fracture propagation predictions from a pseudo 3D model, in accordance with exemplary embodiments of the present techniques. Each of the graphs uses the same $K_{eff}$ ratio to $K_{Ic}$ as the corresponding graph in FIG. 11. Thus, to generate FIG. 12(a) $K_{eff}$ was set equal to $K_{Ic}$. To generate FIG. 12(b), $K_{eff}$ was set to 1.5 $K_{Ic}$. To generate FIG. 12(c), $K_{eff}$ was set to 2 $K_{Ic}$. Finally, to generate FIG. 12(d), $K_{eff}$ was set to 3 $K_{Ic}$. The results confirm those shown in FIG. 11. As the effective fracture toughness increases the effective fracture length decreases.

Further tests were run using the model to determine the effects of increasing the leak-off coefficient on the fractures. As noted previously, a higher leak-off coefficient decreases the effect of fracture toughness on normalized fracture length. For higher leak-off coefficient formation, the leak-off phenomenon dominates the hydraulic fracture process, while the fracture toughness plays a more important role with a higher fracture efficiency of injected fluid. Fracture efficiency is defined as the ratio of the fracture volume to the volume of fluid injected. For low viscosity fluids, fracture toughness can be one of the dominant parameters controlling fracture growth as discussed with respect to FIG. 13.

Figure 13:
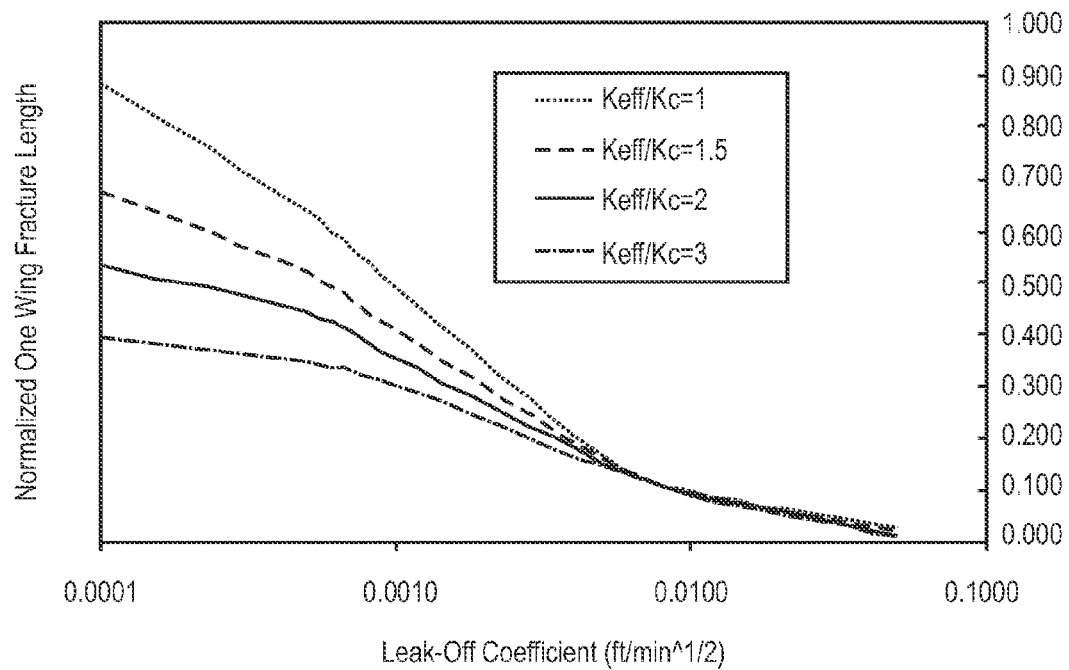
FIG. 13 is a graph of effective fracture toughness at different leak-off coefficients, in accordance with exemplary embodiments of the present techniques.

FIG. 13 is a graph 1300 of effective fracture toughness at different leak-off coefficients, in accordance with exemplary embodiments of the present techniques. From the graph 1300, it can be seen that for a high permeability formation, for example, with leak-off coefficients >0.005, the fracture toughness has less effect on fracture length. Therefore, the application of effective fracture toughness is not necessary. However, for low permeability ductile rock with leak-off coefficients less than 0.001, effective fracture toughness has significant effect on fracture geometry. In embodiments, effective fracture toughness may be used to simulate ductile effect in hydraulic fracture.

Conclusion

In exemplary embodiments, a combined theoretical and numerical method, based on cohesive fracture mechanics and unified creep and plasticity theory, has been used to predict the plasticity effect in hydraulic fracture. An effective fracture parameter for quasi-brittle/ductile rock is proposed. Pore pressure cohesive zone model has been applied to investigate the hydraulic fracture behavior. With the revised UCP constitutive model and the energy based J-integral calculation, the revised fracture toughness can be calculated to include the ductility effect into rock hydraulic fracture. The example indicates that for low permeability ductile rock, the present techniques can predict hydraulic fracture behavior more accurately than currently available modeling tools for hydraulic fracture.

Computing System

Figure 14:
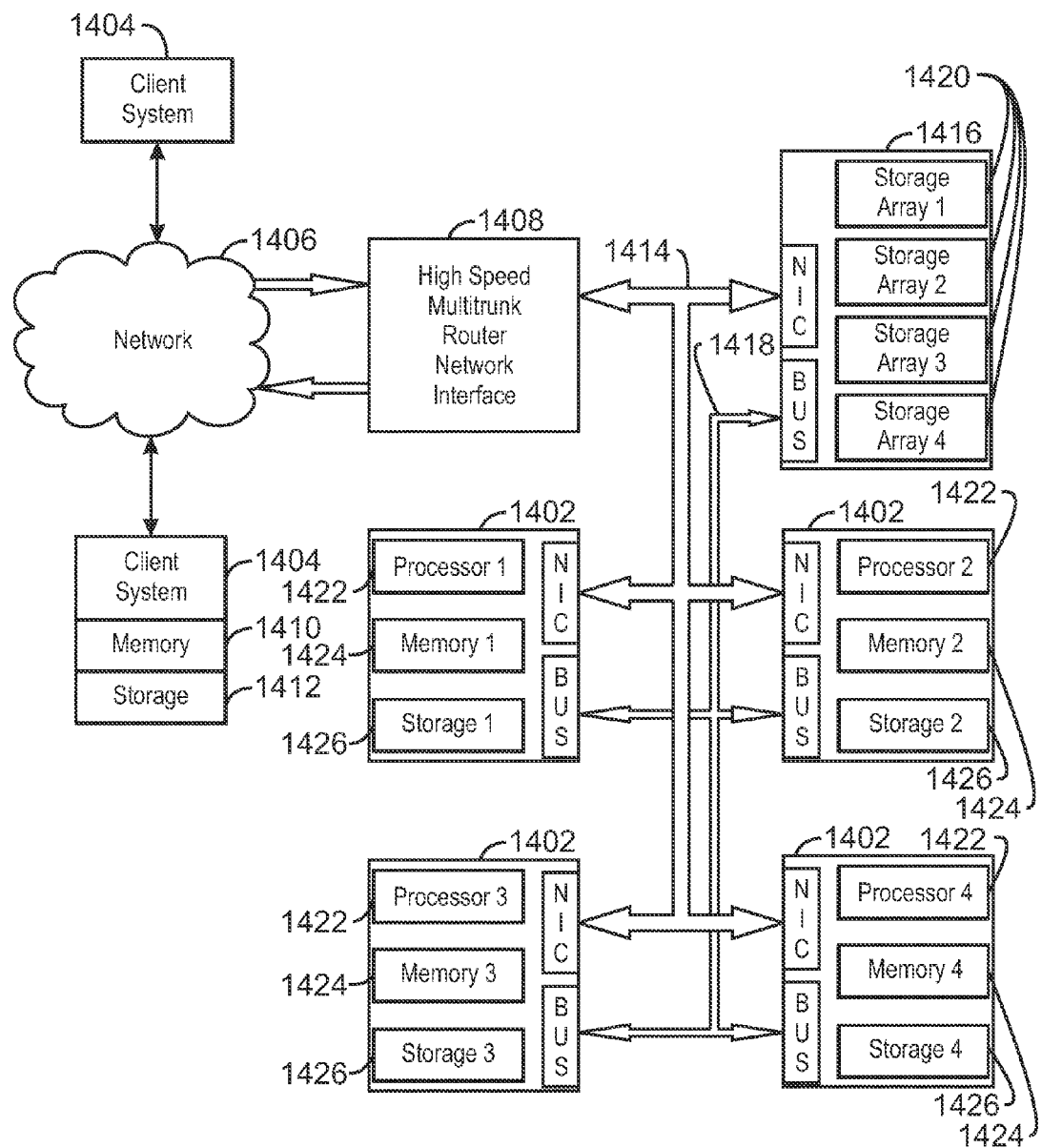
FIG. 14 is a block diagram of an exemplary cluster computing system 1400 that may be used to implement the present techniques, in accordance with exemplary embodiments of the present techniques.

FIG. 14 is a block diagram of an exemplary cluster computing system 1400 that may be used to implement the present techniques, in accordance with exemplary embodiments of the present techniques. The cluster computing system 1400 illustrated has four computing units 1402, each of which may perform calculations for a part of the finite element analysis calculations. However, one of ordinary skill in the art will recognize that the present techniques are not limited to this configuration, as any number of computing configurations may be selected. For example, a smaller analysis may be run on a single computing unit 1402, such as a workstation, while a large finite element analysis calculation may be run on a cluster computing system 1400 having 10, 100, 1000, or even more computing units 1402.

The cluster computing system 1400 may be accessed from one or more client systems 1404 over a network 1406, for example, through a high speed network interface 1408. The computing units 1402 may also function as client systems, providing both local computing support, as well as access to the wider cluster computing system 1400.

The network 1406 may include a local area network (LAN), a wide area network (WAN), the Internet, or any combinations thereof. Each of the client systems 1404 may have non-transitory, computer readable memory 1410 for the storage of operating code and programs, including random access memory (RAM) and read only memory (ROM). The operating code and programs may include the code used to implement all or any portions of the methods discussed herein, for example, as discussed with respect to FIG. 5. Further, the non-transitory computer readable media may hold constitutive models, unified creep theory models, and a combined UCP constitutive model as discussed above. The client systems 1404 can also have other non-transitory, computer readable media, such as storage systems 1412. The storage systems 1412 may include one or more hard drives, one or more optical drives, one or more flash drives, any combinations of these units, or any other suitable storage device. The storage systems 1412 may be used for the storage of UCP constitutive models, code, data, and other information used for implementing the methods described herein.

The high speed network interface 1408 may be coupled to one or more communications busses in the cluster computing system 1400, such as a communications bus 1414. The communication bus 1414 may be used to communicate instructions and data from the high speed network interface 1408 to a cluster storage system 1416 and to each of the computing units 1402 in the cluster computing system 1400. The communications bus 1414 may also be used for communications among computing units 1402 and the storage array 1416. In addition to the communications bus 1414 a high speed bus 1418 can be present to increase the communications rate between the computing units 1402 and/or the cluster storage system 1416.

The cluster storage system 1416 can have one or more non-transitory, computer readable media devices, such as storage arrays 1420 for the storage of UCP constitutive models, data, visual representations, results, code, or other information, for example, concerning the implementation of and results from the methods of FIG. 5, such as, for example, the finite element analysis results. The storage arrays 1420 may include any combinations of hard drives, optical drives, flash drives, holographic storage arrays, or any other suitable devices.

Each of the computing units 1402 can have a processor 1422 and associated local tangible, computer readable media, such as memory 1424 and storage 1426. Each of the processors 1422 may be a multiple core unit, such as a multiple core CPU or a GPU. The memory 1424 may include ROM and/or RAM used to store code, for example, used to direct the processor 1422 to implement the methods discussed with respect to FIG. 5. The storage 1426 may include one or more hard drives, one or more optical drives, one or more flash drives, or any combinations thereof. The storage 1426 may be used to provide storage for UCP constitutive models, intermediate results, data, images, or code associated with operations, including code used to implement the method of FIG. 5.

In other aspects the present techniques and claimed subject matter may include for foreign filing purposes:

1. A method (500) for modeling fractures (302), comprising generating (502) a model that incorporates a unified creep-plasticity (UCP) representation into a constitutive model for a ductile rock (208).

2. The method (500) of paragraph 1, wherein the ductile rock (208) forms fractures (302) that have a fracture process zone (402), wherein the fracture process zone (402) is distributed over a finite size volume and wherein the fracture process zone (402) exhibits strain-softening.

3. The method (500) of paragraph 2, wherein a ratio of a length of the fracture process zone (402) to a length of a non-linear fracture zone (304) located at the tip of a fracture (302) is between about 1:1 and 1:1.5.

4. The method (500) of paragraph 1, further comprising predicting (504) a J-integral value and a stress field that incorporates a plasticity effect from finite element analysis using the model.

5. The method (500) of paragraph 1, further comprising determining (506) an effective fracture property of the ductile rock (208).

6. The method (500) of paragraph 5, further comprising determining the effective fracture property of the ductile rock (208) using a numerical method.

7. The method (500) of paragraph 1, further comprising predicting (508) a fracture (302) in the ductile rock (208).

8. The method (500) of paragraph 7, further comprising predicting a hydraulic fracture (302) of the ductile rock (208) using a pore pressure cohesive zone model (CZM).

9. The method (500) of paragraph 7, further comprising determining a flow of hydrocarbon in a fractured ductile rock (208).

10. The method (500) of paragraph 7, further comprising adjusting a parameter in a fracturing process based, at least in part, on the predicted fracture (302) in the ductile rock (208).

11. The method of paragraph 10, wherein the parameter is a mass flow rate of a fluid, a pressure of a fluid, or a combination thereof.

12. A system (1400) for modeling fractures (302) in a reservoir (102), comprising: a processor (1402); a storage medium (1412, 1420, 1426) comprising a data structure comprising a model that incorporates unified creep-plasticity (UCP) into a constitutive model for a ductile rock; and a computer readable medium (1410, 1424, 1412, 1420, 1426) comprising code configured to direct the processor (1402) to perform a finite element analysis of the ductile rock (208) using the model.

13. The system of paragraph 12, wherein the processor (1402) comprises a multi-processor cluster computer system (1400).

14. The system of paragraph 12, wherein the computer readable medium (1410, 1424, 1412, 1420, 1426) comprises code configured to direct the processor (1402) to run a finite element analysis for predicting a J-integral value and a stress field incorporating plasticity effect using the model.

15. The system of paragraph 12, wherein the computer readable medium comprises (1410, 1424, 1412, 1420, 1426) code configured to direct the processor (1402) to predict a hydraulic fracture (302) in the ductile rock (208).

The present techniques are not limited to the architecture or unit configuration illustrated in FIG. 14. For example, any suitable processor-based device may be utilized for implementing all or a portion of embodiments of the present techniques, including without limitation personal computers, networks personal computers, laptop computers, computer workstations, GPUs, mobile devices, and multi-processor servers or workstations with (or without) shared memory. Moreover, embodiments may be implemented on application specific integrated circuits (ASICs) or very large scale integrated (VLSI) circuits. In fact, persons of ordinary skill in the art may utilize any number of suitable structures capable of executing logical operations according to the embodiments.

While the present techniques may be susceptible to various modifications and alternative forms, the exemplary embodiments discussed above have been shown only by way of example. However, it should again be understood that the present techniques are not intended to be limited to the particular embodiments disclosed herein. Indeed, the present techniques include all alternatives, modifications, and equivalents falling within the true spirit and scope of the appended claims.

What is claimed is:

1. A method for modeling hydraulic fractures in ductile rocks, comprising:
 generating, on a computer, a constitutive model for a quasi-brittle material that incorporates unified creep-plasticity (UCP) based on viscoplasticity theory;
 performing, on a computer, a finite element analysis using the constitutive model, wherein performing the finite element analysis comprises predicting a J-integral value and a stress field that incorporates a plasticity effect from finite element analysis using the constitutive model;
 determining, on a computer, an effective fracture propagation property for the quasi-brittle material based at least in part, upon a result from the finite element analysis;
 predicting, on a computer, hydraulic fractures in the quasi-brittle material, wherein predicting hydraulic fractures in the quasi-brittle material comprises predicting a hydraulic fracture of the ductile rocks using a pore pressure cohesive zone model (CZM); and
 harvesting hydrocarbon from the fractured rock.

2. The method of claim 1, further comprising adjusting a hydraulic fracturing parameter based, at least in part, on the fractures predicted in the ductile rock.

3. The method of claim 1, wherein a ratio between a length of a fracture process zone and a length of a non-linear fracture zone at a tip of a fracture is between about 1:1 and 1:1.5.

4. The method of claim 1, wherein the ductile rock forms fractures that have a fracture process zone, wherein the fracture process zone is distributed over a finite size volume, and wherein the fracture process zone exhibits strain-softening.

5. The method of claim 4, wherein a ratio of a length of the fracture process zone to a length of a non-linear fracture zone located at the tip of a fracture is between about 1:1 and 1:1.5.

6. The method of claim 1, further comprising determining an effective fracture propagation property of the ductile rock.

7. The method of claim 6, further comprising determining the effective fracture propagation property of the ductile rock using a numerical method.

8. The method of claim 1, further comprising predicting a fracture in the ductile rock.

9. The method of claim 8, further comprising adjusting a parameter in a fracturing process based, at least in part, on the predicted fracture in the ductile rock.

10. The method of claim 9, wherein the parameter is a mass flow rate of a fluid, a pressure of a fluid, or a combination thereof.

11. The method of claim 1, further comprising determining a flow of hydrocarbon in a fractured ductile rock.

12. A system for modeling fractures in a reservoir, comprising:
 a processor;
 a storage medium comprising a data structure comprising a model that incorporates unified creep-plasticity (UCP) based on viscoplasticity theory into a constitutive model for a ductile rock; and
 a non-transitory computer readable medium comprising code configured to direct the processor to:
  perform a finite element analysis of the ductile rock using the model, wherein performing the finite element analysis comprises predicting a J-integral value and a stress field that incorporates a plasticity effect from finite element analysis using the constitutive model; and
  predict hydraulic fractures in the ductile rock, wherein predicting hydraulic fractures in the ductile rock comprises using a pore pressure cohesive zone model (CZM), and wherein the prediction is useful for harvesting hydrocarbon from the reservoir.

13. The system of claim 12, wherein the processor comprises a multi-processor cluster computer system.

14. The system of claim 12, wherein the computer readable medium comprises code configured to direct the processor to determine the fracture propagation properties of the ductile rock.

15. The system of claim 12, wherein the computer readable medium comprises code configured to direct the processor to predict a hydraulic fracture in the ductile rock based, at least in part, upon a result from the finite element analysis.

16. The system of claim 12, wherein the computer readable medium comprises code configured to direct the processor to determine a flow of hydrocarbon in a fractured ductile rock.

17. A non-transitory, computer-readable medium comprising a data structure representing a cohesive fracture-mechanics model that combines a constitutive model with a unified creep-plasticity (UCP) model based on viscoplasticity theory, further comprising code configured to direct a processor to:
 perform a finite element analysis using the constitutive model, wherein performing the finite element analysis comprises predicting a J-integral value and a stress field that incorporates a plasticity effect from finite element analysis using the constitutive model;
 determine an effective fracture property for a ductile rock based at least in part, upon a result from the finite element analysis; and
 predict fractures in the ductile rock, wherein predicting fractures in the ductile rock comprises using a pore pressure cohesive zone model (CZM), and wherein the prediction is useful for harvesting hydrocarbon from the fractures in the ductile rock.

18. A method for harvesting hydrocarbons from a ductile rock formation, comprising:
 generating, on a computer, a model that incorporates unified creep-plasticity (UCP) based on viscoplasticity theory into a constitutive model for a ductile rock;
 performing, on a computer, a finite element analysis using the model, wherein performing the finite element analysis comprises predicting a J-integral value and a stress field that incorporates a plasticity effect from finite element analysis using the constitutive model;
 predicting, on a computer, fractures in a ductile rock formation based, at least in part, upon a result from the finite element analysis, wherein predicting fractures in the ductile rock formation comprises using a pore pressure cohesive zone model (CZM);
 fracturing the ductile rock formation using parameters based, at least in part, on the prediction of the fractures; and
 harvesting hydrocarbons from the fractured rock.

* * * * *